(12) United States Patent
    Takenaka

(10) Patent No.: US 10,298,273 B2
(45) Date of Patent: May 21, 2019

(54) DEMULTIPLEXING APPARATUS AND METHOD OF DESIGNING THE APPARATUS

(71) Applicant: Murata Manufacturing Co., Ltd., Kyoto (JP)

(72) Inventor: Isao Takenaka, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/964,970

(22) Filed: Apr. 27, 2018

(65) Prior Publication Data

US 2018/0248569 A1    Aug. 30, 2018

Related U.S. Application Data

(63) Continuation of application No. PCT/JP2016/080810, filed on Oct. 18, 2016.

(30) Foreign Application Priority Data

Nov. 4, 2015    (JP) .................................. 2015-217124

(51) Int. Cl.
*H04B 1/40* (2015.01)
*H04B 1/00* (2006.01)
(Continued)

(52) U.S. Cl.
CPC ........... *H04B 1/0057* (2013.01); *H03F 1/565* (2013.01); *H03F 3/19* (2013.01); *H03F 3/21* (2013.01);
(Continued)

(58) Field of Classification Search
CPC ...................................................... H04B 1/40
See application file for complete search history.

(56) References Cited

U.S. PATENT DOCUMENTS

2003/0011443 A1* 1/2003 Liu ........................... H03F 1/56
                                                              333/126
2005/0197153 A1* 9/2005 Kim ....................... H04B 1/006
                                                              455/552.1
(Continued)

FOREIGN PATENT DOCUMENTS

JP    2004-166248 A    6/2004
JP    2007-181021 A    7/2007
(Continued)

OTHER PUBLICATIONS

International Search Report for International Application No. PCT/JP2016/080810, dated Jan. 10, 2017.
(Continued)

*Primary Examiner* — Cindy Trandai
(74) *Attorney, Agent, or Firm* — Pearne & Gordon LLP

(57) ABSTRACT

A demultiplexing apparatus according to the present disclosure includes an amplifier that amplifies transmission signals in three or more communication bands having different frequency bands; multiple signal paths which are commonly provided for an output terminal of the amplifier and on which the signals in the corresponding communication bands are propagated; and multiple transmission-reception filters which are provided on the multiple signal paths, and each of which isolates a transmission signal and a reception signal of the corresponding communication band from each other. The gains of the amplifier in the frequency bands of multiple reception signals are smaller than the gains of the amplifier in the frequency bands of multiple transmission signals.

20 Claims, 17 Drawing Sheets

(51) Int. Cl.
    *H04B 1/50*       (2006.01)
    *H03F 1/56*       (2006.01)
    *H03F 3/19*        (2006.01)
    *H03F 3/21*        (2006.01)
    *H03H 11/34*     (2006.01)
    *H03F 3/24*        (2006.01)
    *H03F 3/72*        (2006.01)
    *H03H 7/38*        (2006.01)

(52) U.S. Cl.
    CPC ............... *H03F 3/245* (2013.01); *H03F 3/72* (2013.01); *H03H 11/34* (2013.01); *H04B 1/50* (2013.01); *H03F 2200/111* (2013.01); *H03F 2200/171* (2013.01); *H03F 2200/387* (2013.01); *H03F 2200/451* (2013.01); *H03F 2203/7209* (2013.01); *H03H 7/38* (2013.01)

(56) References Cited

U.S. PATENT DOCUMENTS

| | | | |
|---|---|---|---|
| 2005/0233764 A1* | 10/2005 | Solski .................... | H03H 7/383 455/552.1 |
| 2006/0223368 A1 | 10/2006 | Hayashi | |
| 2007/0115065 A1* | 5/2007 | Fukuda .................. | H03F 1/086 330/302 |
| 2007/0161419 A1* | 7/2007 | Dakeya .................. | H01Q 1/084 455/575.7 |
| 2007/0222697 A1* | 9/2007 | Caimi .................... | H01Q 1/243 343/861 |
| 2007/0273527 A1* | 11/2007 | Yamagajo ........ | G06K 19/07749 340/572.7 |
| 2009/0204372 A1* | 8/2009 | Johnston ................ | G01S 19/22 702/191 |
| 2009/0315792 A1* | 12/2009 | Miyashita .............. | H01Q 1/243 343/742 |
| 2010/0238844 A1 | 9/2010 | Kanou | |
| 2012/0063368 A1 | 3/2012 | Boyle | |
| 2012/0087282 A1 | 4/2012 | Shibahara | |
| 2012/0208473 A1* | 8/2012 | Aparin .................. | H04B 1/0458 455/73 |
| 2012/0235737 A1* | 9/2012 | Reisner ................ | H03F 1/0222 330/127 |
| 2013/0225088 A1* | 8/2013 | Anderson ................ | H04B 1/18 455/62 |
| 2013/0234741 A1* | 9/2013 | Mow ...................... | H01Q 1/243 324/750.01 |
| 2014/0328222 A1 | 11/2014 | Mao et al. | |
| 2014/0354350 A1* | 12/2014 | Bowers ................... | H03F 3/195 327/564 |
| 2015/0008980 A1* | 1/2015 | Kim ........................ | H03F 1/565 330/250 |
| 2015/0028945 A1* | 1/2015 | Gaynor ................... | H03F 3/189 330/107 |
| 2015/0180428 A1* | 6/2015 | Pham ...................... | H03F 3/211 330/295 |
| 2015/0222233 A1* | 8/2015 | Kimura ................ | H03F 1/0205 330/295 |
| 2015/0311922 A1* | 10/2015 | Bakalski ................ | H04B 1/006 455/552.1 |
| 2016/0070017 A1* | 3/2016 | Leek ........................ | G01V 3/02 324/658 |
| 2016/0077140 A1* | 3/2016 | Todi ........................ | G01R 27/02 333/17.3 |
| 2016/0112009 A1 | 4/2016 | Hitomi et al. | |
| 2016/0116525 A1* | 4/2016 | Nobbe ...................... | H03F 3/72 324/537 |
| 2016/0336903 A1* | 11/2016 | Ahmed .................. | H03F 1/0288 |
| 2016/0352496 A1* | 12/2016 | Sjoland .................... | H04B 1/18 |
| 2017/0026136 A1* | 1/2017 | Thompson .............. | H04B 1/006 |
| 2017/0163484 A1* | 6/2017 | Hou ...................... | H04B 1/0057 |
| 2017/0187334 A1* | 6/2017 | Banowetz ................ | H03F 1/30 |
| 2017/0199948 A1* | 7/2017 | Raihn .................. | G06F 17/5063 |
| 2017/0330731 A1* | 11/2017 | Van Zyl ............ | H01J 37/32183 |
| 2017/0338839 A1* | 11/2017 | Little .................... | H04B 1/0057 |

FOREIGN PATENT DOCUMENTS

| | | |
|---|---|---|
| JP | 2007-267319 A | 10/2007 |
| JP | 2008-236608 A | 10/2008 |
| JP | 2012-519445 A | 8/2012 |
| JP | 2015-504283 A | 2/2015 |
| WO | 2011/001769 A1 | 1/2011 |
| WO | 2015/002127 A1 | 1/2015 |

OTHER PUBLICATIONS

Written Opinion for International Application No. PCT/JP2016/080810, dated Jan. 10, 2017.

* cited by examiner

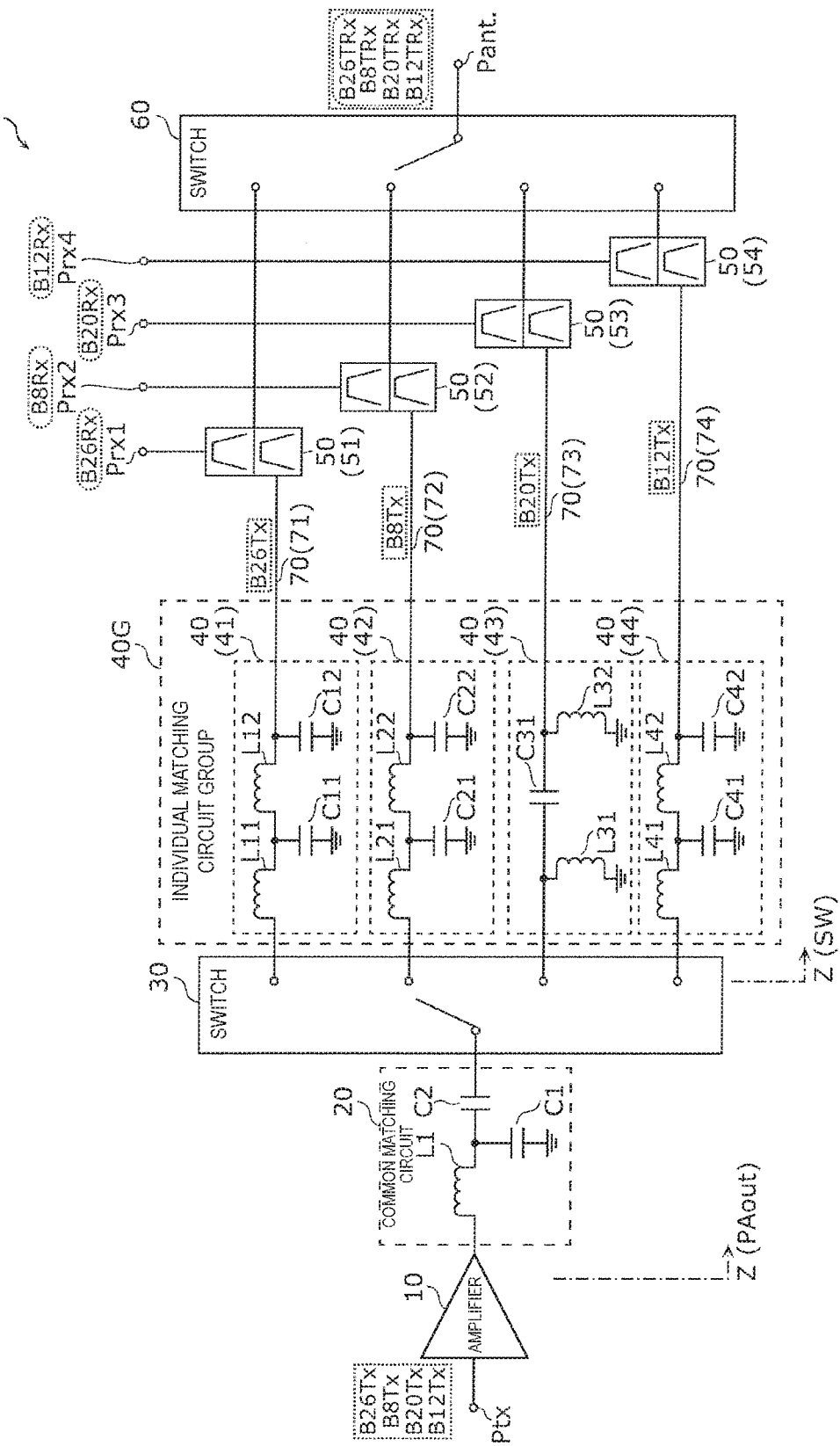

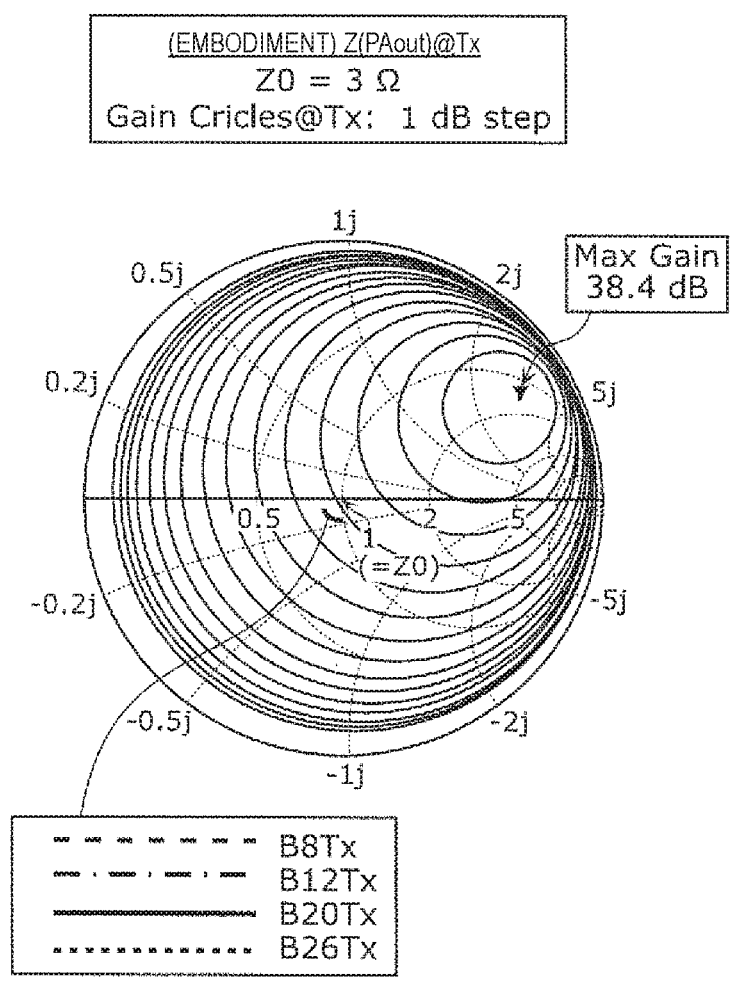

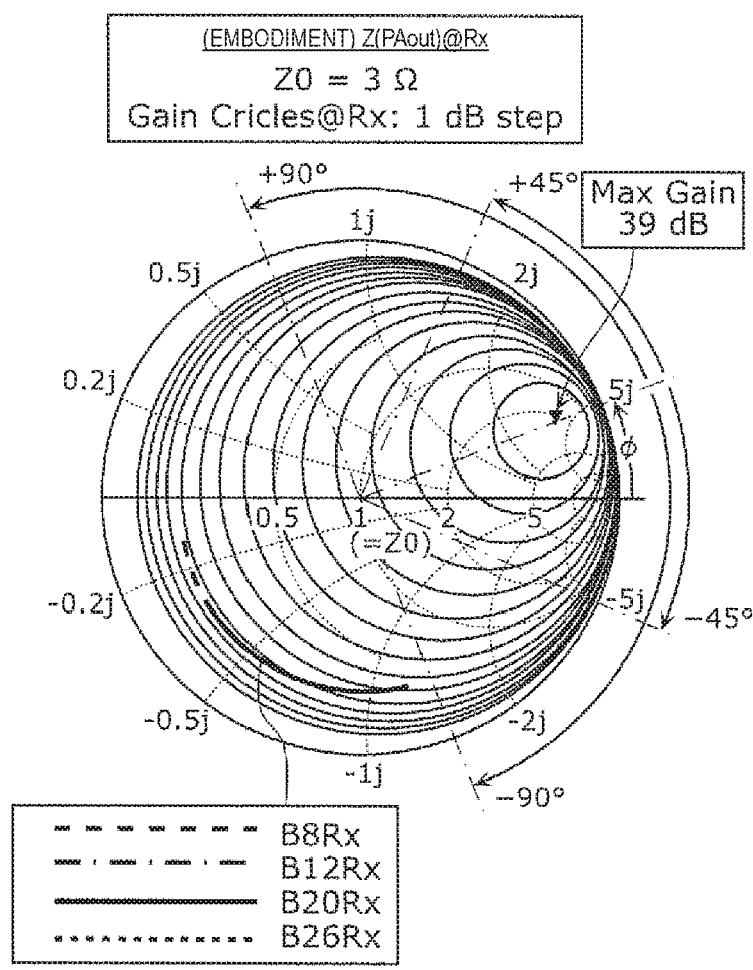

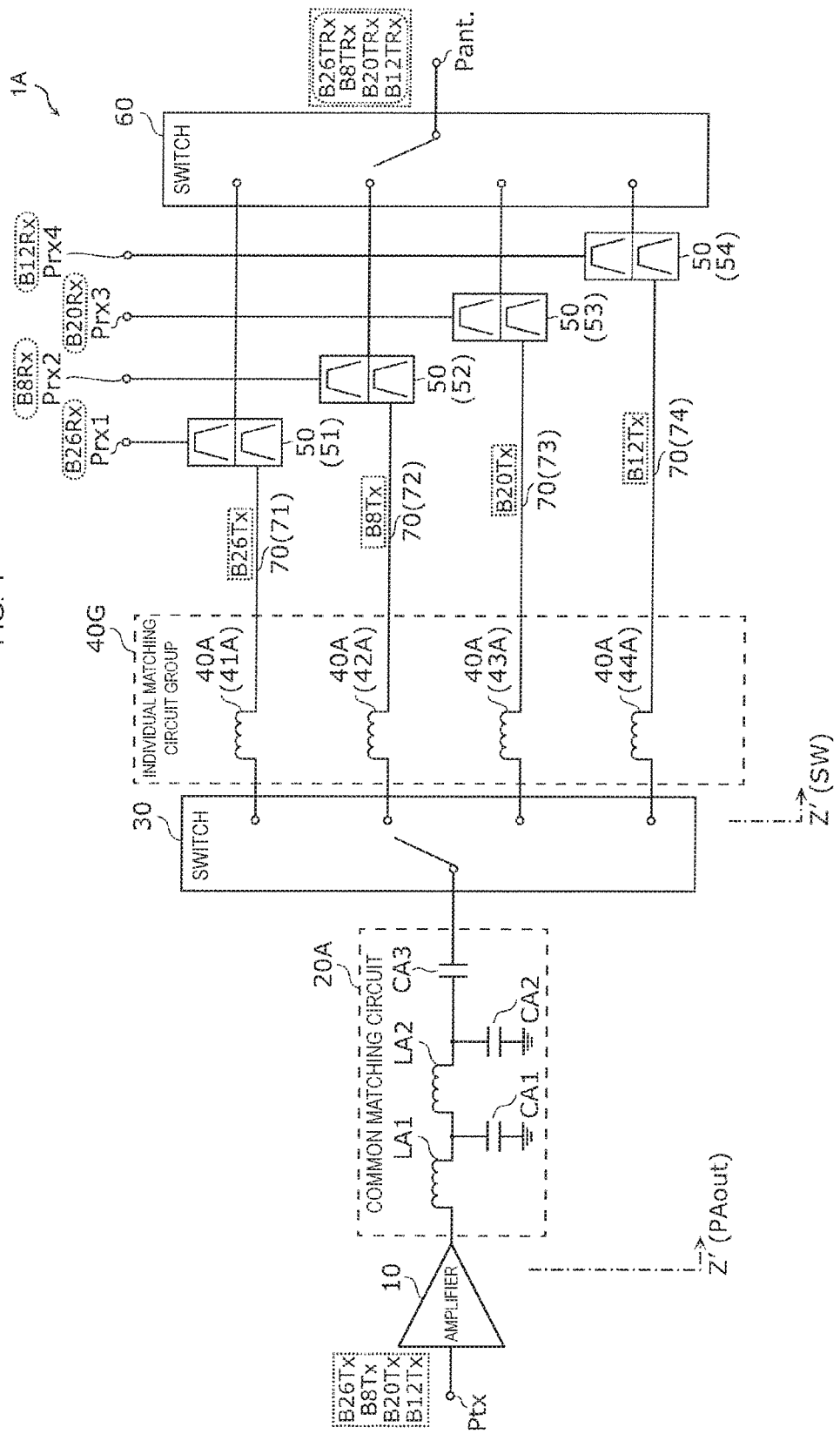

DEMULTIPLEXING APPARATUS AND METHOD OF DESIGNING THE APPARATUS

This is a continuation of International Application No. PCT/JP2016/080810 filed on Oct. 18, 2016 which claims priority from Japanese Patent Application No. 2015-217124 filed on Nov. 4, 2015. The contents of these applications are incorporated herein by reference in their entireties.

BACKGROUND

Technical Field

The present disclosure relates to a demultiplexing apparatus and a method of designing the demultiplexing apparatus. More particularly, the present disclosure relates to a demultiplexing apparatus capable of supporting three or more communication bands and a method of designing the demultiplexing apparatus.

Configurations have hitherto been known in which demultiplexing apparatuses including amplifiers are incorporated in transmitters in wireless communication machines in which transmission frequency bands are different from reception frequency bands (For example, refer to Patent Document 1). In such a transmitter (demultiplexing apparatus), an impedance matching-phase adjustment circuit is provided upstream of the amplifier to adjust the phase of a transmission signal input into the amplifier to a phase within a predetermined phase range. Accordingly, with the above transmitter, it is possible to suppress noise components in the reception frequency band.

Patent Document 1: Japanese Unexamined Patent Application Publication No. 2007-181021

BRIEF SUMMARY

Support of multiple communication bands, that is, so-called multiband communication is required for the demultiplexing apparatuses used in communication machines in recent years.

However, in configurations in which common amplifiers are used to cause the demultiplexing apparatuses in the related art to support the multiband communication, signal paths in communication bands having degraded reception sensitivity may occur.

In order to resolve such problems, for example, a configuration is supposed in which the impedance matching-phase adjustment circuits are provided for the signal paths in the respective communication bands. However, with such a configuration, it is difficult to adjust the phase of the transmission signal to a phase within an appropriate phase range if the number of the signal paths in the communication bands is increased along with the multiband communication. Accordingly, isolation between transmission and reception terminals is degraded, suppression of the noise components in the reception frequency band is made difficult, and the communication band having degraded reception sensitivity may occur even in the above configuration.

In order to challenge the problems described above, the present disclosure provides a demultiplexing apparatus capable of suppressing degradation of the isolation between the transmission and reception terminals while supporting the multiband communication to suppress an occurrence of the communication band having degraded reception sensitivity and a method of designing the demultiplexing apparatus.

A demultiplexing apparatus according to an aspect of the present disclosure includes an amplifier that amplifies transmission signals in three or more communication bands having different frequency bands; multiple signal paths which are commonly provided for an output terminal of the amplifier and on which the signals in the corresponding communication bands are propagated; and multiple transmission-reception filters which are provided on the multiple signal paths and each of which isolates a transmission signal and a reception signal of the corresponding communication band from each other. The gains of the amplifier in the frequency bands of multiple reception signals are smaller than the gains of the amplifier in the frequency bands of multiple transmission signals.

With the above demultiplexing apparatus, the signals amplified by the amplifier, which are in the frequency bands of the multiple reception signals, are smaller than the signals amplified by the amplifier, which are in the frequency bands of the multiple transmission signals. Accordingly, it is possible to suppress the signals in the frequency bands of the reception signals, which leak into the reception side via the transmission-reception filters. In other words, it is possible to suppress degradation of isolation between transmission and reception terminals while supporting multiband communication to suppress an occurrence of the communication band having degraded reception sensitivity.

A demultiplexing apparatus according to another aspect of the present disclosure includes an amplifier that amplifies transmission signals in three or more communication bands having different frequency bands; multiple signal paths which are commonly provided for an output terminal of the amplifier and on which the signals in the corresponding communication bands are propagated; and multiple transmission-reception filters which are provided on the multiple signal paths and each of which isolates a transmission signal and a reception signal of the corresponding communication band from each other. First load impedance in the frequency bands of multiple reception signals when the multiple transmission-reception filters side is viewed from the output terminal may be positioned in an area the phase of which is apart from that of a maximum point of a gain of the amplifier by 45 degrees or more in a first Smith chart normalized with respect to output impedance of the amplifier.

The positioning of the first load impedance in an area the phase of which is apart from that of the maximum point of the gain of the amplifier by 45 degrees or more in the first Smith chart in the above manner enables all the gains of the amplifier in the frequency bands of the multiple reception signals to be made smaller than all the gains of the amplifier in the frequency bands of the multiple transmission signals. Accordingly, advantages similar to the advantages described above are achieved. In other words, it is possible to suppress the degradation of the isolation between the transmission and reception terminals while supporting the multiband communication to suppress an occurrence of the communication band having degraded reception sensitivity.

The first load impedance may be positioned in an area the phase of which is apart from that of the maximum point by 90 degrees or more in the first Smith chart.

The positioning of the first load impedance in an area the phase of which is apart from that of the maximum point of the gain of the amplifier by 90 degrees or more in the first Smith chart in the above manner enables the gains to be equalized while suppressing the gains of the amplifier in the frequency bands of the reception signals. Accordingly, it is possible to suppress the variation in the reception sensitivity in the same communication band.

The gains of the amplifier in the frequency bands of the multiple reception signals may be smaller than the gains of the amplifier in the frequency bands of the multiple transmission signals.

With the above configuration, it is possible to further suppress an occurrence of the communication band having degraded reception sensitivity.

The demultiplexing apparatus may further include a common matching circuit provided between the output terminal and a common node of the multiple signal paths and multiple individual matching circuits provided on the multiple signal paths between the common node and the multiple transmission-reception filters.

With the multiple individual matching circuits individually provided on the multiple signal paths, the load impedance in the frequency bands of the reception signals when the individual matching circuits side is viewed from the output terminal of the common matching circuit is capable of being adjusted with high accuracy. Accordingly, it is possible to adjust the load impedance to the phase at which the impedance matching is easily achieved with the common matching circuit.

The phases of second load impedance in the frequency bands of the multiple reception signals when the multiple transmission-reception filters side is viewed from the common node may substantially coincide with each other in a second Smith chart normalized with respect to impedance of the multiple signal paths.

With the above configuration, the phases of the load impedance in the frequency bands of the reception signals (the reception signal bands) when the individual matching circuits side is viewed from the output terminal of the common matching circuit substantially coincide with each other. Consequently, the impedance in the frequency bands is capable of being matched in the multiple communication bands on the same condition at the output terminal of the amplifier. In other words, the impedance matching is achieved in the multiple communication bands with the same matching circuit. As a result, it is possible to achieve the impedance matching in a broad band including the frequency bands of the reception signals in the multiple communication bands with the common matching circuit.

Each of the multiple individual matching circuits may be configured so that the amount of phase rotation of the second load impedance due to the provision of the individual matching circuit is made small in the second Smith chart.

Configuring the individual matching circuits so that the amount of phase rotation is decreased enables the excellent impedance matching to easily achieved and enables the size of the individual matching circuits to be reduced.

Each of one or more individual matching circuits, among the multiple individual matching circuits, may be composed of a high pass filter type matching circuit or a low pass filter type matching circuit having a smaller amount of phase rotation of the second load impedance in the second Smith chart.

Each of one or more individual matching circuits, among the multiple individual matching circuits, may be composed of wiring or an inductor.

With the above configuration, the circuit configuration is simplified and reduced in size.

Each of the common matching circuit and the multiple individual matching circuits may include an LC filter of one or more stages, which is composed of an inductor and a capacitor, and each of the multiple individual matching circuits may include an LC filter of the number of stages, which is larger than that of the common matching circuit.

The provision of the multiple individual matching circuits having the number of stages in the LC filter, which is larger than that of the common matching circuit, enables the common matching circuit to be simplified and reduced in size while adjusting with high accuracy the load impedance in the frequency bands of the reception signals (the reception signal bands) when the individual matching circuits side is viewed from the output terminal of the common matching circuit.

Each of one or more individual matching circuits, among the multiple individual matching circuits, may be incorporated in the corresponding transmission-reception filter.

With the above configuration, the demultiplexing apparatus is simplified and reduced in size.

The demultiplexing apparatus may further include a switch that is provided between the common matching circuit and the multiple individual matching circuits and that selectively connects each of the multiple signal paths to the common node or disconnects each of the multiple signal paths from the common node.

The switch may be used to connect two or more signal paths, among the multiple signal paths, to the common node.

With the above configuration, the demultiplexing apparatus is applicable to a so-called carrier aggregation (CA) method in which different communication bands are concurrently used.

A method of designing a demultiplexing apparatus according to an aspect of the present disclosure is the method of designing the following demultiplexing apparatus. Specifically, the demultiplexing apparatus includes an amplifier that amplifies transmission signals in three or more communication bands having different frequency bands, multiple signal paths which are commonly provided for an output terminal of the amplifier and on which the signals in the corresponding communication bands are propagated, multiple transmission-reception filters which are provided on the multiple signal paths and each of which isolates a transmission signal and a reception signal of the corresponding communication band from each other, a common matching circuit provided between the output terminal and a common node of the multiple signal paths, and multiple individual matching circuits provided on the multiple signal paths between the common node and the multiple transmission-reception filters. The method of designing the demultiplexing apparatus includes a first adjusting step of adjusting the element values of the multiple individual matching circuits so that phases of load impedance in the frequency bands of multiple reception signals when the multiple transmission-reception filters side is viewed from the common node substantially coincide with each other in a Smith chart normalized with respect to impedance of the multiple signal paths; and a second adjusting step of adjusting the element value of the common matching circuit so that the load impedance in the frequency bands of the multiple reception signals when the multiple transmission-reception filters side is viewed from the output terminal is positioned in an area the phase of which is apart from that of the maximum point of the gain of the amplifier by 45 degrees or more in a Smith chart normalized with respect to output impedance of the amplifier after the first adjusting step.

According to the demultiplexing apparatus and so on according to the present disclosure, it is possible to suppress the degradation of the isolation between the transmission and reception terminals while supporting the multiband communication to suppress an occurrence of the communication band having degraded reception sensitivity.

BRIEF DESCRIPTION OF THE SEVERAL VIEWS OF THE DRAWINGS

FIG. 1 is a diagram illustrating the circuit configuration of a PA module according to an embodiment.

FIG. 2A is a Smith chart illustrating load impedance and gain circles in transmission signal bands on an end face of an output terminal of an amplifier in the embodiment.

FIG. 3A is a Smith chart illustrating load impedance and gain circles in reception signal bands on the end face of the output terminal of the amplifier in the embodiment.

FIG. 4 is a diagram illustrating the circuit configuration of a PA module according to a comparative example of the embodiment.

DETAILED DESCRIPTION

Figure 2B:
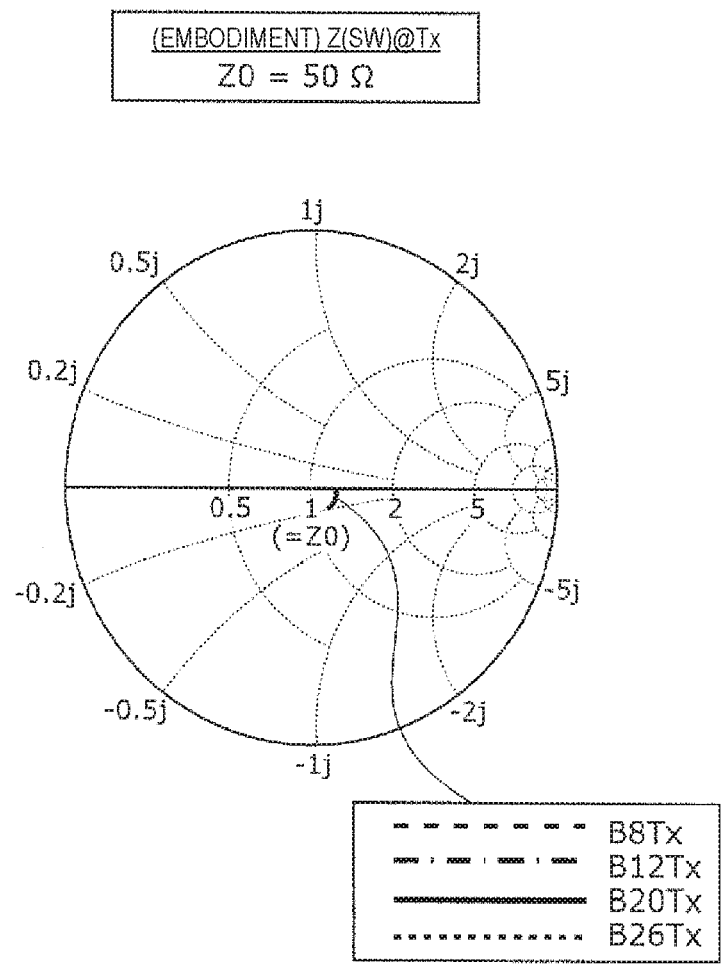
FIG. 2B is a Smith chart illustrating load impedance in the transmission signal bands on an end face of a selection terminal of a switch in the embodiment.

Embodiments of the present disclosure will herein be described in detail with reference to the drawings. The embodiments described below indicate comprehensive or specific examples. Numerical values, materials, components, the arrangement of the components, the connection mode of the components, the method of deigning the components, the order of steps in the designing method, and so on, which are indicated in the embodiments described below, are only examples and are not intended to limit the present disclosure. Among the components in the embodiments described below, the components that are not described in the independent claims may be described as optional components. In addition, "connection" in the following embodiments means not only direct connection but also electrical connection via another element or the like.

The diagrams are schematic diagrams and are not necessarily strictly illustrated. The same reference numerals are used in the drawings to identify the substantially same components and duplicated description of such components may be omitted or simplified.

A power amplifier (PA) module is exemplified as a demultiplexing apparatus including an amplifier that amplifies transmission signals in three or more communication bands having different frequency bands in the embodiment and modifications described below.

Embodiment

[1. Configuration]

A PA module according to an embodiment is a module that amplifies a transmission signal input from, for example, a radio frequency integrated circuit (RFIC) and outputs the amplified signal to an antenna or the like. Specifically, the PA module is a module capable of amplifying transmission signals in three or more communication bands and is installed in a compact wireless communication device, such as a cellular phone, conforming to a communication standard, such as Long Term Evolution (LTE).

FIG. 1 is a diagram illustrating the circuit configuration of a PA module 1 according to the present embodiment. Signals input or output through a transmission input terminal Ptx, an antenna terminal Pant., reception output terminals Prx1 to Prx4 are illustrated with being surrounded by broken lines in FIG. 1.

The PA module 1 illustrated in FIG. 1 is a multiband PA module capable of switching the communication band used for transmission and reception.

As illustrated in FIG. 1, the PA module 1 amplifies the transmission signals in three or more communication bands, which are input through the transmission input terminal Ptx, and outputs the amplified signals through the antenna terminal Pant. In addition, the PA module 1 outputs reception signals in the three or more communication bands, which are input through the antenna terminal Pant., through the reception output terminals Prx1 to Prx4.

In the present embodiment, the PA module 1 supports, for example, four communication bands: Band26 (a transmission signal band: 814 MHz to 849 MHz and a reception signal band: 859 MHz to 894 MHz), Band8 (a transmission signal band: 880 MHz to 915 MHz and a reception signal band: 925 MHz to 960 MHz), Band20 (a transmission signal band: 832 MHz to 862 MHz and a reception signal band: 791 MHz to 821 MHz), and Band12 (a transmission signal band: 699 MHz to 716 MHz and a reception signal band: 729 MHz to 746 MHz).

In other words, the transmission signals of the four communication bands are input through the transmission input terminal Ptx. Referring to FIG. 1, the signals (the transmission signals) input through the transmission input terminal Ptx are illustrated with being surrounded by a rectangular broken line. For example, the transmission signal in Band26 is represented by "B26Tx".

The transmission signals of the four communication bands are output through the antenna terminal Pant., and the reception signals of the four communication bands are input through the antenna terminal Pant. Referring to FIG. 1, the signals output through the antenna terminal Pant. or the signals input through the antenna terminal Pant. (the transmission signals or the reception signals, that is, transmission-reception signals) are illustrated with being surrounded by a rectangular broken line and a rounded rectangular double broken line. For example, the transmission-reception signal in Band26 is represented by "B26TRx".

The reception signals of the four communication bands are output through the reception output terminals Prx1 to Prx4. Referring to FIG. 1, the signals (the reception signals) output through the reception output terminals Prx1 to Prx4 are illustrated with being surrounded by rounded rectangular broken lines. For example, the reception signal in Band26 is represented by "B26Rx".

Although Band26 is exemplified for description of the representation of the transmission signals, the reception signals, and the transmission-reception signals, the signals in the communication bands other than Band26 are represented in the same manner using reference numerals corresponding to the communication bands. The same applies to the other diagrams described below. In other diagrams described below, the representation of the above signals may be used as the frequency bands of the transmission signals and the reception signals.

A specific configuration of the PA module 1 will now be described.

As illustrated in FIG. 1, in the present embodiment, the PA module 1 includes an amplifier 10, a common matching circuit 20, a switch 30, an individual matching circuit group 40G including multiple individual matching circuits 40, multiple transmission-reception filters 50, a switch 60, and multiple signal paths 70.

The amplifier 10 is, for example, a multiband power amplifier integrated circuit (PAIC) that amplifies the transmission signals in three or more communication bands having different frequency bands. In the present embodiment, the amplifier 10 amplifies the transmission signals of the four communication bands (Band26, Band8, Band20, and Band12 here).

The amplifier 10 includes a power amplifier circuit, such as a broadband amplifier circuit, which is manufactured using a semiconductor substrate made of Si, GaAs, or the like. The power amplifier circuit includes, for example, amplifier elements, such as field effect transistors (FETs) or heterojunction bipolar transistors (HBTs), which are connected in multiple stages, and is formed on the semiconductor substrate. The power amplifier circuit may include a matching circuit disposed between the stages of the multiple amplifier elements or at an input end portion or an output end portion.

The common matching circuit 20 is a matching circuit provided between an output terminal of the amplifier 10 and a common node of the multiple signal paths 70 (four signal paths 71 to 74 in the present embodiment). The common node is a node at which the multiple signal paths 70 are bundled and is a common terminal of the switch 30 in the present embodiment.

The common matching circuit 20 is a circuit that achieves impedance matching between output impedance of the amplifier 10 and the common node. Although the common matching circuit 20 is configured (designed) so as to meet certain conditions, the conditions are described below and an exemplary specific configuration of the common matching circuit 20 will be described here. The configuration of the common matching circuit 20 described below is an example and the common matching circuit 20 may have any configuration as long as the certain conditions described below are met.

A matching circuit generally includes a series reactance element and a parallel reactance element. The common matching circuit 20 of the present embodiment is composed of a T-shaped circuit that sequentially includes an inductor L1 and a capacitor C2 from the amplifier 10 side as the series reactance elements and that includes a capacitor C1 as the parallel reactance element. The capacitor C1 shunts a connection node between the inductor L1 and the capacitor C2 to the ground.

The switch 30 is a demultiplexer that is provided between the common matching circuit 20 and the multiple individual matching circuits 40 (four individual matching circuits 41 to 44 in the present embodiment) and that selectively connects each of the multiple signal paths 70 to the common node or disconnects each of the multiple signal paths 70 from the common node. In other words, the switch 30 is used to switch connection between an output terminal of the common matching circuit 20 and the individual matching circuit group 40G.

The switch 30 includes, for example, one common terminal and four selection terminals. The one common terminal is connected to the output terminal of the common matching circuit 20 and the four selection terminals are respectively connected to one terminals of the individual matching circuits 41 to 44. The switch 30 connects one of the four selection terminals to the common terminal, for example, in response to a control signal from the RFIC.

The switch 30 functions as a band switching switch that switches the communication band of the PA module 1 with the switch 60.

The individual matching circuits 40 are matching circuits provided on the multiple signal paths 70 between the common node and the multiple transmission-reception filters 50. In the present embodiment, the four individual matching circuits 40 (the individual matching circuits 41 to 44) are provided on the four signal paths 70 (the signal paths 71 to 74).

Each of the multiple individual matching circuits 40 is configured (designed) so as to meet certain conditions. The conditions are described below and an exemplary specific configuration of the individual matching circuits 40 will be described here. The configuration of the individual matching circuits 40 described below is an example and the individual matching circuits 40 may have any configuration as long as the certain conditions described below are met.

The multiple individual matching circuits 40 correspond to the respective communication bands of the transmission signals input into the PA module 1.

Specifically, the individual matching circuit 41 is a matching circuit that corresponds to Band26 and that is provided on the signal path 71 and is a circuit that achieves the impedance matching between the switch 30 and a transmission-reception filter 51. In the present embodiment, the individual matching circuit 41 sequentially includes an inductor L11, which is the series reactance element, capacitor C11, which is the parallel reactance element, inductor L12, which is the series reactance element, and capacitor C12, which is the parallel reactance element, from the switch 30 side. In other words, the individual matching circuit 41 is a low pass filter type (LPF type) matching circuit composed of a two-stage LC filter.

The individual matching circuit 42 is a matching circuit that corresponds to Band8 and that is provided on the signal path 72 and is a circuit that achieves the impedance matching between the switch 30 and a transmission-reception filter 52. In the present embodiment, the individual matching circuit 42 is the LPF type matching circuit composed of a two-stage LC filter, like the individual matching circuit 41. The individual matching circuit 42 includes inductors L21 and L22 and capacitors C21 and C22.

The individual matching circuit 43 is a matching circuit that corresponds to Band20 and that is provided on the signal path 73 and is a circuit that achieves the impedance matching between the switch 30 and a transmission-reception filter 53. In the present embodiment, the individual matching circuit 43 sequentially includes an inductor L31, which is the parallel reactance element, a capacitor C31, which is the series reactance element, and an inductor L32, which is the parallel reactance element, from the switch 30 side. In other words, the individual matching circuit 43 is a high pass filter type (HPF type) matching circuit composed of a π-type LC filter.

The individual matching circuit 44 is a matching circuit that corresponds to Band12 and that is provided on the signal path 74 and is a circuit that achieves the impedance matching between the switch 30 and a transmission-reception filter 54. In the present embodiment, the individual matching circuit 44 is the LPF type matching circuit composed of a two-stage LC filter, like the individual matching circuit 41. The individual matching circuit 44 includes inductors L41 and L42 and capacitors C41 and C42.

The numbers of stages of the individual matching circuits 40 configured in the above manners are not specifically limited. For example, each of the individual matching circuits 41, 42, and 44 may be composed of an LC filter of one stage or an LC filter of three or more stages. In addition, for example, the individual matching circuit 43 is not limited to the π-type configuration and may have a T-type configuration or an L-type configuration. Furthermore, the LC filters composing the respective individual matching circuits 40 may have the same number of stages or may have different numbers of stages.

The multiple transmission-reception filters 50 are, for example, duplexers composed of surface acoustic wave (SAW) filters or the likes, which are provided on the multiple signal paths 70 and each of which isolates the transmission signal and the reception signal of the corresponding communication band from each other. Specifically, each transmission-reception filter 50 includes a transmission terminal connected to the corresponding individual matching circuit 40, a common terminal connected to the antenna terminal Pant. via the switch 60, and a reception terminal connected to the reception output terminal in the corresponding communication band, among the reception output terminals Prx1 to Prx4. In the present embodiment, the four transmission-reception filters 50 (the transmission-reception filters 51 to 54) are provided on the four signal paths 70 (the signal paths 71 to 74).

The transmission-reception filter 51, corresponds to Band26, is provided on the signal path 71, and the transmission-reception filter 51 isolates the transmission signal and the reception signal in Band26 from each other. Specifically, the transmission-reception filter 51 filters the transmission signal supplied from the individual matching circuit 41 to the transmission terminal in the band of the transmission signal in Band26 and outputs the transmission signal subjected to the filtering through the common terminal. In addition, the transmission-reception filter 51 filters the reception signal supplied from the antenna terminal Pant. to the common terminal via the switch 60 in the band of the reception signal in Band26 and supplies the reception signal subjected to the filtering to the reception output terminal Prx1.

Since the transmission-reception filters 52 to 54 are substantially similar to the transmission-reception filter 51 except that the transmission-reception filters 52 to 54 are provided on the signal paths 70 different from that of the transmission-reception filter 51 and the transmission signals and the reception signals to be isolated are in the communication bands different from that of the transmission-reception filter 51, a detailed description of the transmission-reception filters 52 to 54 is omitted herein.

The switch 60 is provided between the multiple transmission-reception filters 50 and the antenna terminal Pant., and the switch 60 selectively connects each of the multiple signal paths 70 to the antenna terminal Pant. or disconnects each of the multiple signal paths 70 from the antenna terminal Pant. The switch 60 includes four selection terminals and one common terminal in the present embodiment and the four selection terminals are connected to the transmission terminals of the four transmission-reception filters 51 to 54. The switch 60 connects one of the four selection terminals to the common terminal, for example, in response to a control signal from the RFIC.

The multiple signal paths 70 are transmission paths (wiring), such as microstrip lines, which are commonly provided for the output terminal of the amplifier 10 and on which the signals in the corresponding communication bands are propagated. In the present embodiment, the multiple signal paths 70 are provided so as to be capable of being connected to the output terminal of the amplifier 10 with the switch 30.

The PA module 1 described above is composed as, for example, the following composite module.

Specifically, the composite module includes a circuit board, such as a resin multilayer substrate, in which low temperature co-fired ceramic substrates (LTCC substrates) or glass epoxy substrates are laminated. The amplifier 10, the common matching circuit 20, the switch 30, the individual matching circuit group 40G, the switch 60, and so on are mounted as integrated circuits (ICs) or chip components on such a circuit board. These ICs or chip components are sealed with sealing resin, such as epoxy resin. The transmission-reception filters 50 composed of SAW filters or the likes may be mounted on the circuit board or the sealing resin.

[2. Characteristics]

Characteristics of the PA module 1 configured in the above manner will be described here.

The characteristics of the PA module 1 in transmission signal bands will now be described with reference to FIG. 2A and FIG. 2B.

FIG. 2A is a Smith chart illustrating load impedance and gain circles in the transmission signal bands on an end face of the output terminal of the amplifier 10 in the PA module 1 according to the present embodiment.

The transmission signal bands mean the bands of the transmission signals in the respective communication bands. For example, the transmission signal band of Band26 is 814 MHz to 849 MHz. The gain circles are lines drawn by plotting points at which the amplifier 10 has a constant gain in the transmission signal bands. The gain circles are drawn from a maximum gain point (Max Gain in FIG. 2A) 38.4 dB at intervals of 1 dB in FIG. 2A.

The Smith chart illustrated in FIG. 2A is a first Smith chart normalized with respect to the output impedance (3Ω in the present embodiment) of the amplifier 10. The load impedance illustrated in FIG. 2A is first load impedance (load impedance Z (PAout) in FIG. 1) when the multiple transmission-reception filters 50 side is viewed from the output terminal of the amplifier 10. The load impedance in the frequency bands of the multiple transmission signals (that is, the transmission signals in the multiple communication bands) is illustrated in FIG. 2A.

As illustrated in FIG. 2A, the load impedance Z (PAout) in the transmission signal band is positioned in a central portion of the first Smith chart in any communication band.

FIG. 2A indicates that the amplifier 10 performs the amplification using the same gain for the transmission signals of all the communication bands from the relationship between the gain circles and the load impedance Z (PAout) in each communication band illustrated in FIG. 2A.

FIG. 2B is a Smith chart illustrating load impedance in the transmission signal bands on an end face of the selection terminal of the switch 30 in the PA module 1 according to the present embodiment.

Specifically, the Smith chart illustrated in FIG. 2B is a second Smith chart normalized with respect to characteristic impedance (50Ω in the present embodiment) of the multiple signal paths 70. The load impedance illustrated in FIG. 2B is second load impedance (load impedance Z (SW) in FIG. 1) when the multiple transmission-reception filters 50 side is viewed from the end face of the selection terminal of the switch 30. The load impedance in the frequency bands of the multiple transmission signals (that is, the transmission signals in the multiple communication bands) is illustrated in FIG. 2B.

As illustrated in FIG. 2B, the load impedance Z (SW) in the transmission signal band is positioned in a central portion of the second Smith chart in any communication band.

The characteristics of the PA module 1 in reception signal bands will now be described with reference to FIG. 3A and FIG. 3B.

FIG. 3A is a Smith chart illustrating load impedance and gain circles in the reception signal bands on the end face of the output terminal of the amplifier 10 in the PA module 1 according to the present embodiment.

The reception signal bands mean the bands of the reception signals in the respective communication bands. For example, the reception signal band of Band26 is 859 MHz to 894 MHz. The gain circles are lines drawn by plotting points at which the amplifier 10 has a constant gain in the reception signal bands. The gain circles are drawn from a maximum gain point (Max Gain in FIG. 3A) 39 dB at intervals of 1 dB in FIG. 3A.

The Smith chart and the load impedance illustrated in FIG. 3A are the first Smith chart and the first load impedance, as in FIG. 2A. The load impedance Z (PAout) in the frequency bands of the multiple reception signals (that is, the reception signals in the multiple communication bands) is illustrated in FIG. 3A.

In comparison between FIG. 3A and FIG. 2A, each of the gains of the amplifier 10 in the frequency bands of the multiple reception signals illustrated in FIG. 3A (the reception signals in Band26, Band8, Band20, and Band12 in the present embodiment) is smaller than each of the gains of the amplifier 10 in the frequency bands of the multiple transmission signals illustrated in FIG. 2A (the transmission signals in Band26, Band8, Band20, and Band12 in the present embodiment). In other words, all the gains in the reception signal bands (Rx-band gains) are smaller than all the gains in the transmission signal bands (Tx-band gains).

In other words, in the PA module 1 according to the present embodiment, the common matching circuit 20 described above is configured so as to meet such relationship between the Rx-band gains and the Tx-band gains.

Specifically, as illustrated in FIG. 3A, the locus of the load impedance Z (PAout) in the frequency bands of the multiple reception signals (the locus illustrated by B8Rx, B12Rx, B20Rx, and B26Rx in FIG. 3A) is positioned in an area in which the gain of the amplifier 10 is smaller than 31 dB. In contrast, as illustrated in FIG. 2A, the locus of the load impedance Z (PAout) in the frequency bands of the multiple transmission signals (the locus illustrated by B8Tx, B12Tx, B20Tx, and B26Tx in FIG. 2A) is positioned in an area in which the gain of the amplifier 10 is greater than or equal to 33 dB. In other words, all the gain ranges of the amplifier 10 from lower limit frequencies to upper limit frequencies in the frequency bands of the respective multiple reception signals are smaller than all the gain ranges of the amplifier 10 from the lower limit frequencies to the upper limit frequencies in the frequency bands of the respective multiple transmission signals. All the gain ranges in the reception signal bands are smaller than all the gain ranges in the transmission signal bands.

In the present disclosure, as illustrated in FIG. 3A, the load impedance Z (PAout) in the frequency bands of the multiple reception signals is positioned in an area the phase of which is apart from that of a maximum point of the gain (maximum gain point) of the amplifier 10 by 45 degrees or more in the first Smith chart normalized with respect to the output impedance of the amplifier 10.

In other words, in the PA module 1 according to the present embodiment, the common matching circuit 20 described above is configured so that such relationship is established between the load impedance Z (PAout) in the frequency bands of the multiple reception signals and the maximum point of the gain of the amplifier 10.

Specifically, the locus of the load impedance Z (PAout) in the frequency bands of the multiple reception signals is positioned in a phase area that is $\phi+45°$ or more and $\phi-45°$ or less where $\phi$ denotes the phase of the maximum gain point in the first Smith chart illustrated in FIG. 3A. Although the locus of the load impedance Z (PAout) is lengthened as the frequency band of the reception signals is widened, all the loci are positioned in the phase area that is $\phi+45°$ or more and $\phi-45°$ or less in the present embodiment.

In other words, in the first Smith chart illustrated in FIG. 3A, the load impedance Z (PAout) are positioned in an area the phase of which is apart from that of the maximum gain point by 45 degrees or more from the lower limit frequencies to the upper limit frequencies in the frequency bands of the respective multiple reception signals.

In addition, as illustrated in FIG. 3A, the load impedance Z (PAout) can be positioned in an area the phase of which is apart from that of the maximum point of the gain (maximum gain point) of the amplifier 10 by 90 degrees or more in the first Smith chart. In other words, the above locus can be positioned in a phase area that is $\phi+90°$ or more and $\phi-90°$ or less in the first Smith chart.

Figure 3B:
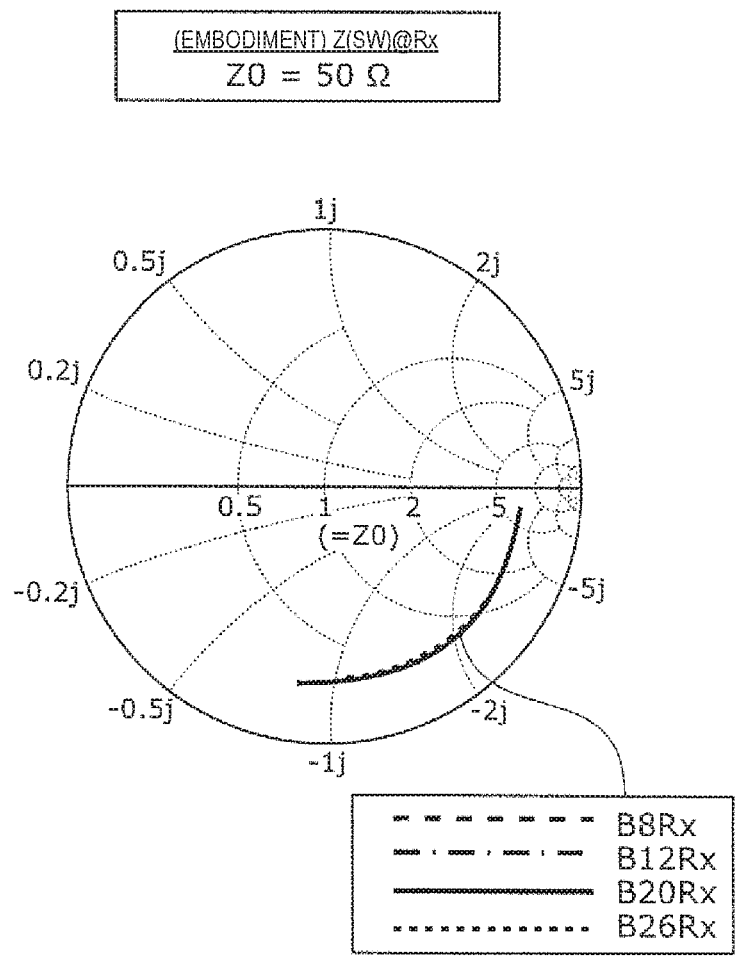
FIG. 3B is a Smith chart illustrating load impedance in the reception signal bands on the end face of the selection terminal of the switch in the embodiment.

FIG. 3B is a Smith chart illustrating load impedance in the reception signal bands on the end face of the selection terminal of the switch 30 in the PA module 1 according to the present embodiment.

Specifically, the Smith chart and the load impedance illustrated in FIG. 3B are the second Smith chart and the second load impedance, as in FIG. 2B. The load impedance Z (SW) in the frequency bands of the multiple reception signals (that is, the reception signals in the multiple communication bands) is illustrated in FIG. 3B.

As illustrated in FIG. 3B, the phases of the load impedance Z (SW) in the frequency bands of the multiple reception signals substantially coincide with each other in the second Smith chart normalized with respect to the characteristic impedance of the multiple signal paths 70. In other words, in the second Smith chart, the phases of the load impedance in the frequency bands of the multiple reception signals when the multiple transmission-reception filters 50 side is viewed from the common terminal of the switch 30 also substantially coincide with each other. The "substantial coincidence" includes not only complete coincidence but also approximate coincidence. For example, not-complete coincidence due to any error or the difference in band width between the frequency bands is also included in the "substantial coincidence".

In other words, in the PA module 1 according to the present embodiment, the multiple individual matching circuits 40 described above are configured on a condition in which the phases of the load impedance Z (SW) in the frequency bands of the reception signals in the corresponding communication bands substantially coincide with each other. That is, each of the multiple individual matching circuits 40 is configured so that the phase condition of the load impedance Z (SW) is within an arbitrary phase range in the second Smith chart.

Specifically, the amount of phase rotation by the individual matching circuit 40 is increased with the increasing element values of the series reactance elements and the parallel reactance elements. Accordingly, when the amount of phase rotation for moving the phase of the load impedance Z (SW) to the arbitrary phase range is large, it is sufficient to provide the series reactance elements and the parallel reactance elements having larger element values in the individual matching circuit 40.

In addition, in the present embodiment, each of the multiple individual matching circuits 40 is configured so that the amount of phase rotation of the load impedance Z (SW) due to the provision of the individual matching circuit 40 is made small in the second Smith chart normalized with respect to the characteristic impedance of the multiple signal paths 70.

Specifically, each of the multiple individual matching circuits 40 is composed of either of the HPF type matching circuit and the LPF type matching circuit, in which the amount of phase rotation of the load impedance Z (SW) is made small in the second Smith chart. Due to the provision of the individual matching circuit 40, the phase of the load impedance Z (SW) is rotated in the left direction in the second Smith chart when the individual matching circuit 40 is of the HPF type and is rotated in the right direction in the second Smith chart when the individual matching circuit 40 is of the LPF type. Accordingly, the individual matching circuit 40 is composed of the HPF type matching circuit or the LPF type matching circuit so that the phase is rotated in the direction, among the right direction and the left direction, having a smaller amount of phase rotation for moving the phase of the load impedance Z (SW) to the arbitrary phase range in the second Smith chart.

For example, in the present embodiment, in a state in which the individual matching circuit 40 is provided, the load impedance Z (SW) of Band26, Band8, and Band12 is positioned in an area in which the amount of phase rotation to the arbitrary phase range in the right direction is smaller than that in the left direction. Accordingly, the individual matching circuits 41, 42, and 44 corresponding to Band26, Band8, and Band12, respectively, are composed of the LPF type matching circuits, as described above. In contrast, in the state in which the individual matching circuit 40 is provided, the load impedance Z (SW) of Band20 is positioned in an area in which the amount of phase rotation to the arbitrary phase range in the left direction is smaller than that in the right direction. Accordingly, the individual matching circuit 43 corresponding to Band20 is composed of the HPF type matching circuit, as described above.

[3. Advantages and So On]

Advantages of the PA module 1 according to the present embodiment will now be described using a PA module according to a comparative example of the present embodiment based on how the inventor of the application has made the present disclosure.

The inventor of the application considered a configuration in which the phase adjustment circuit is provided for each of the multiple communication bands, as in the demultiplexing apparatus in the related art, described in Patent Document 1, to suppress noise components in the reception signals, which are caused by the transmission signals output from the amplifier 10.

FIG. 4 is a diagram illustrating the circuit configuration of a PA module 1A according to the comparative example, which has been made based on the above idea. The PA module 1A illustrated in FIG. 4 differs from the PA module 1 according to the embodiment in the configuration of a common matching circuit 20A and multiple individual matching circuit 40A.

Specifically, the multiple individual matching circuits 40A illustrated in FIG. 4 (four individual matching circuits 41A to 44A here) are inductors for adjusting the phases of the signals output from the amplifier 10.

The common matching circuit 20A illustrated in FIG. 4 sequentially includes an inductor LA1, which is the series reactance element, a capacitor CA1, which is the parallel reactance element, an inductor LA2, which is the series reactance element, a capacitor CA2, which is the parallel reactance element, and a capacitor CA3, which is the series reactance element, from the amplifier 10 side.

Characteristics of the PA module 1A configured in the above manner will be described here.

The characteristics of the PA module 1A in the transmission signal bands will now be described with reference to FIG. 5A and FIG. 5B.

Figure 5A:
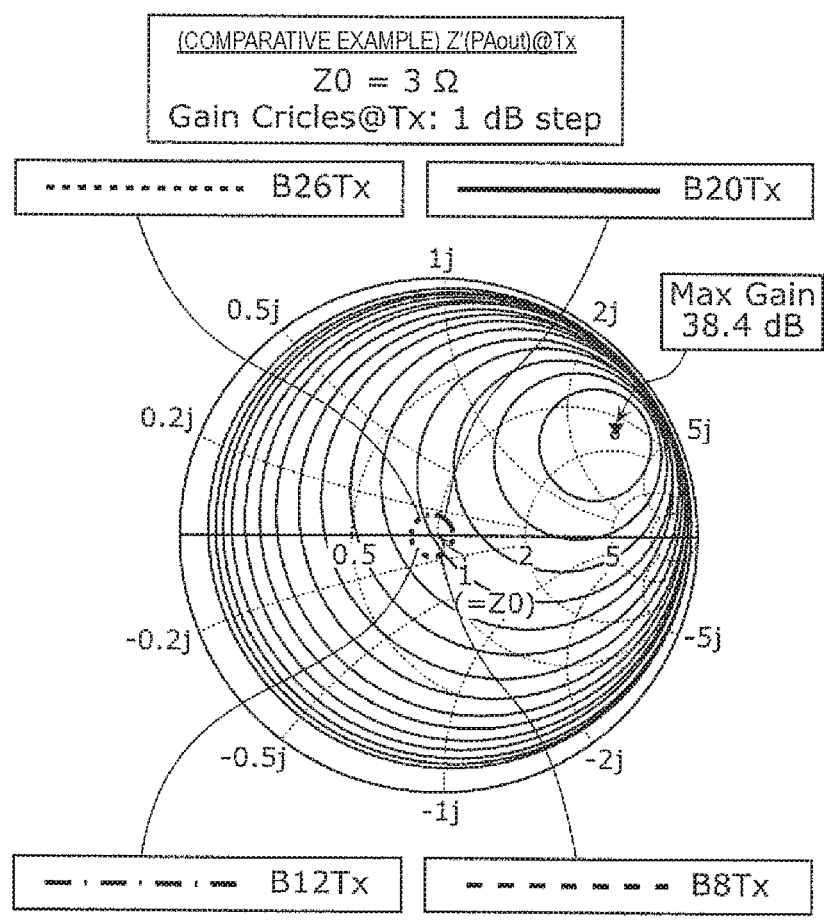
FIG. 5A is a Smith chart illustrating load impedance and gain circles in the transmission signal bands on the end face of the output terminal of the amplifier in the comparative example of the embodiment.

FIG. 5A is a Smith chart illustrating load impedance and gain circles in the transmission signal bands on the end face of the output terminal of the amplifier 10 in the PA module 1A according to the comparative example.

Specifically, the Smith chart illustrated in FIG. 5A is the first Smith chart normalized with respect to the output impedance of the amplifier 10, as in FIG. 2A. The load impedance illustrated in FIG. 5A is load impedance (load impedance Z' (PAout) in FIG. 4) when the multiple transmission-reception filters 50 side is viewed from the output terminal of the amplifier 10 in the comparative example. The load impedance in the frequency bands of the multiple transmission signals (that is, the transmission signals in the multiple communication bands) is illustrated in FIG. 5A.

As illustrated in FIG. 5A, the load impedance Z' (PAout) in the transmission signal band is positioned in a central portion of the first Smith chart in any communication band.

FIG. 5A indicates that the amplifier 10 performs the amplification using the same gain for the transmission signals of all the communication bands from the relationship between the gain circles and the load impedance Z' (PAout) in each communication band illustrated in FIG. 5A.

Figure 5B:
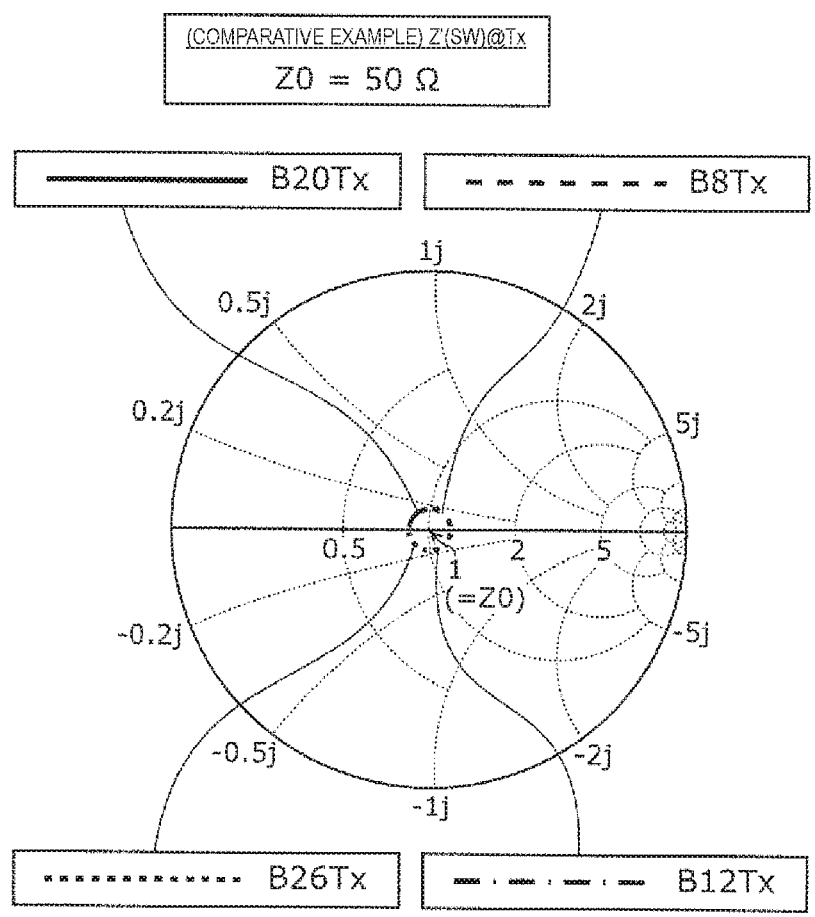
FIG. 5B is a Smith chart illustrating load impedance in the transmission signal bands on the end face of the selection terminal of the switch in the comparative example of the embodiment.

FIG. 5B is a Smith chart illustrating load impedance in the transmission signal bands on the end face of the selection terminal of the switch 30 in the PA module 1A according to the comparative example.

Specifically, the Smith chart illustrated in FIG. 5B is the second Smith chart normalized with respect to the characteristic impedance (50Ω in the present embodiment) of the multiple signal paths 70, as in FIG. 2B. The load impedance illustrated in FIG. 5B is load impedance (load impedance Z' (SW) in FIG. 4) when the multiple transmission-reception filters 50 side is viewed from the end face of the selection terminal of the switch 30. The load impedance in the frequency bands of the multiple transmission signals (that is, the transmission signals in the multiple communication bands) is illustrated in FIG. 5B.

As illustrated in FIG. 5B, the load impedance Z' (SW) in the transmission signal band is positioned in a central portion of the second Smith chart in any communication band.

As described above, even in the configuration of the comparative example, the characteristics of the PA module 1A in the transmission signal bands have no problem. However, the inventor of the application found that reception sensitivity may be degraded in the PA module 1A of the comparative example in development of multiband PA modules.

Accordingly, the inventor of the application measured the load impedance Z' (PAout) and the load impedance Z' (SW) in the reception signal bands of the multiple communication bands in order to identify a factor in the degradation of the reception sensitivity.

Figure 6A:
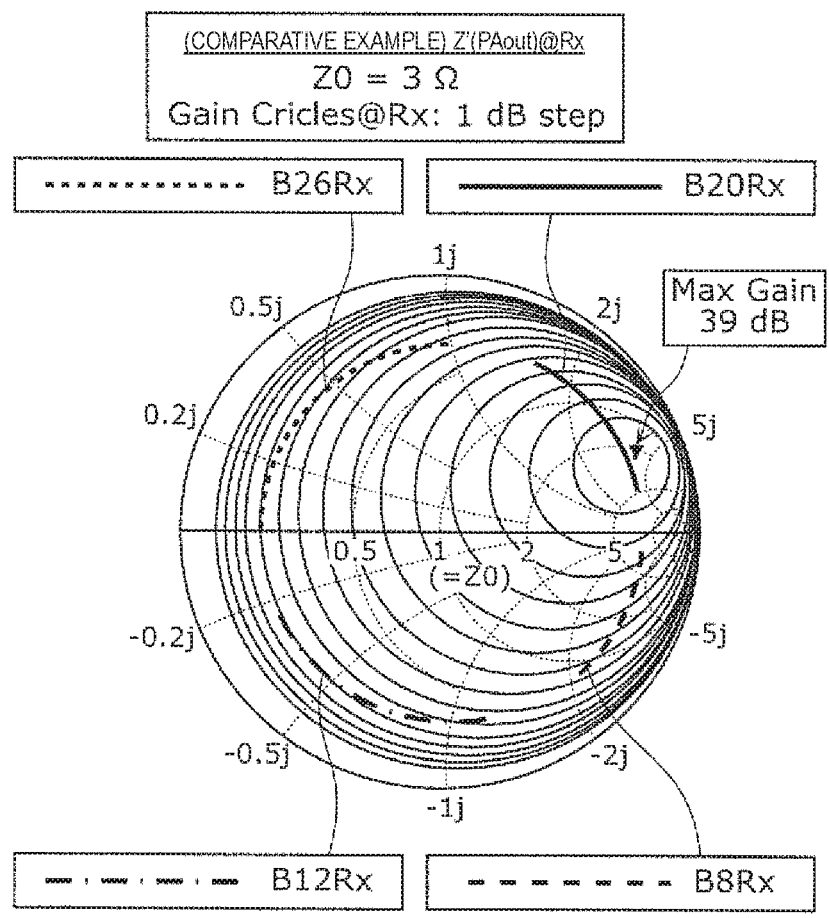
FIG. 6A is a Smith chart illustrating load impedance and gain circles in the reception signal bands on the end face of the output terminal of the amplifier in the comparative example of the embodiment.
Figure 6B:
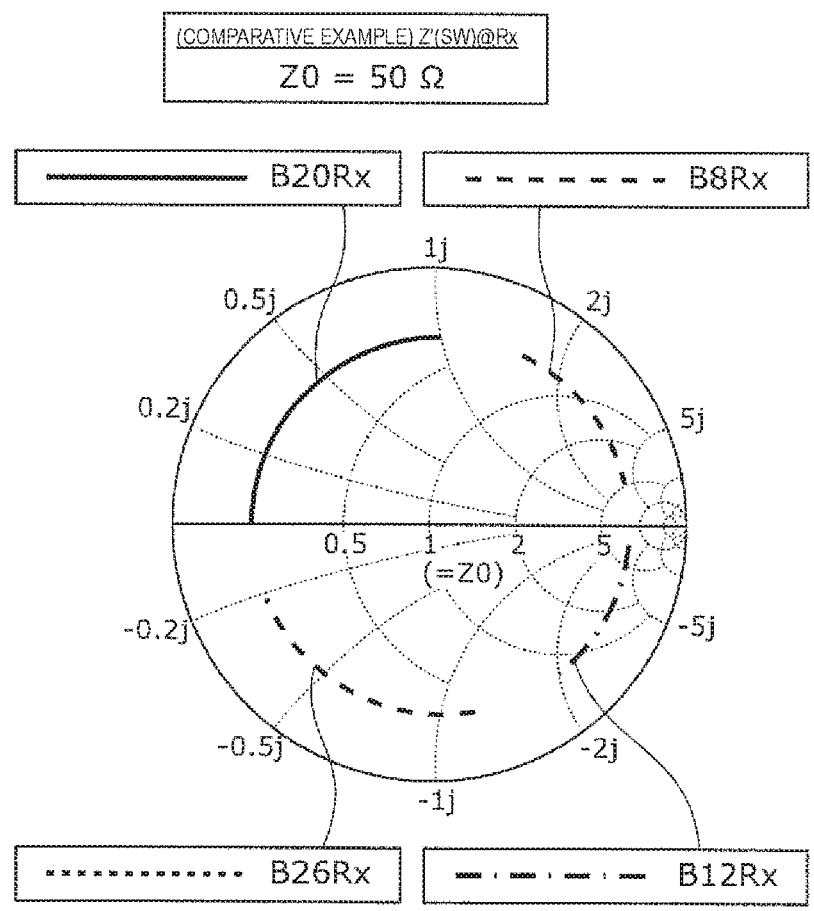
FIG. 6B is a Smith chart illustrating load impedance in the reception signal bands on the end face of the selection terminal of the switch in comparative example of the embodiment.

FIG. 6A and FIG. 6B are Smith charts illustrating the load impedance Z' (PAout) and the load impedance Z' (SW). Specifically, FIG. 6A is a Smith chart illustrating the load impedance and the gain circles in the reception signal bands on the end face of the output terminal of the amplifier 10 in the PA module 1A according to the comparative example. FIG. 6B is a Smith chart illustrating the load impedance in the reception signal bands on the end face of the selection terminal of the switch 30 in the PA module 1A according to the comparative example.

The Smith chart illustrated in FIG. 6A is the first Smith chart normalized with respect to the output impedance of the amplifier 10, as in FIG. 2A. The Smith chart illustrated in FIG. 6B is the second Smith chart normalized with respect to the characteristic impedance (50Ω in the present embodiment) of the multiple signal paths 70, as in FIG. 2B.

As illustrated in FIG. 6A, the load impedance Z' (PAout) in the reception signal band is positioned in a peripheral portion of the first Smith chart in any communication band. This has no problem in terms of transmission characteristics.

However, the inventor of the application found that this may cause the degradation of the reception sensitivity.

Specifically, the inventor of the application found that a communication band in which the load impedance Z' (PAout) is positioned in an area in which the gain of the amplifier 10 is large may exist from the relationship between the gain circles and the load impedance Z' (PAout) in the reception signal band of each communication band, which is illustrated in FIG. 6A. For example, in the case of Band20, the load impedance Z' (PAout) in the reception signal band is positioned in an area relatively close to the maximum gain point (Max Gain in FIG. 6A).

From the above fact, the inventor of the application acquired an idea that the large gain of the amplifier 10 in the reception signal band may cause the degradation of the reception sensitivity.

Accordingly, the inventor of the application acquired a first idea about the PA module 1 according to the present embodiment. Specifically, the inventor of the application acquired an idea that all the gains of the amplifier 10 in the frequency bands of the multiple reception signals are made smaller than all the gains of the amplifier 10 in the frequency bands of the multiple transmission signals.

In addition, the inventor of the application found the following matter as the factor in the existence of the communication band in which the load impedance Z' (PAout) is positioned in an area in which the gain of the amplifier 10 is large.

Specifically, as illustrated in FIG. 6A, the phases of the load impedance Z' (PAout) in the reception signal bands in the multiple communication bands are varied in the first Smith chart. Accordingly, for example, as in Band20, the communication band in which the load impedance Z' (PAout) is positioned in an area relatively close to the maximum point of the gain of the amplifier 10 exists in the first Smith chart.

Accordingly, the inventor of the application acquired a second idea about the PA module 1 according to the present embodiment. Specifically, the inventor of the application acquired an idea that the load impedance Z' (PAout) in the reception signal bands of the multiple communication bands is positioned in a certain phase area in the first Smith chart.

Furthermore, the inventor of the application found the following matter as the factor in the existence of the above communication band.

Specifically, as illustrated in FIG. 6B, the phases of the load impedance Z' (SW) in the reception signal bands when the multiple transmission-reception filters 50 side is viewed from the end face of the selection terminal of the switch 30 are varied between the multiple communication bands in the PA module 1A of the comparative example. Accordingly, the phases of the load impedance Z' (PAout) resulting from similar rotation of the phases for the multiple communication bands by providing the common matching circuit 20A are also varied, as in the phase variation of the load impedance Z' (SW).

From the above fact, the inventor of the application acquired an idea that the phase variation of the load impedance Z' (SW) is suppressed, that is, the phase conditions are equalized in the second Smith chart as an aspect of realizing the second idea.

As described above, in the demultiplexing apparatus of the present embodiment (the PA module 1 in the present embodiment), the gains of the amplifier 10 in the frequency bands of the multiple reception signals (the reception signals in Band26, Band8, Band20, and Band12 in the present embodiment) are smaller than the gains of the amplifier 10 in the frequency bands of the multiple transmission signals (the transmission signals in Band26, Band8, Band20, and Band12 in the present embodiment).

As a result, the signals amplified by the amplifier 10, which are in the frequency bands of the multiple reception signals, are smaller than the signals amplified by the amplifier 10, which are in the frequency bands of the multiple transmission signals. Accordingly, it is possible to suppress the signals (Rx-band noise) in the frequency bands of the reception signals, which leak into the reception side via the transmission-reception filters 50. In other words, it is possible to suppress degradation of isolation between transmission and reception terminals while supporting multiband communication to suppress an occurrence of the communication band having degraded reception sensitivity. The isolation between the transmission and reception terminals means isolation between the terminal through which the transmission signal is input and the terminal through which the reception signal is output and, in the present embodiment, means isolation between the transmission input terminal Ptx—reception output terminal Prxi (i=1 to 4).

Figure 7:
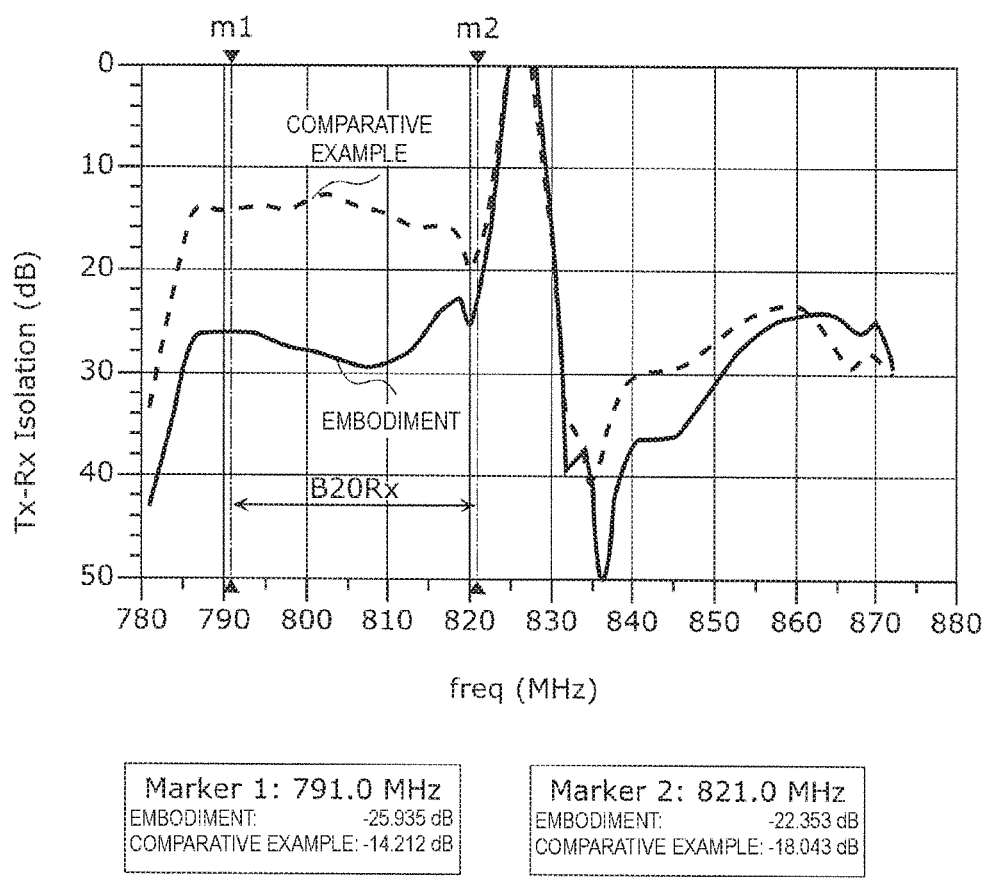
FIG. 7 is a graph illustrating isolation characteristics in Band20 in the present embodiment and the comparative example.

An example for indicating such advantages will now be described with reference to FIG. 7. FIG. 7 is a graph illustrating isolation characteristics in Band20 in the present embodiment and the comparative example. Specifically, the isolation between the transmission input terminal Ptx—the reception output terminal Prx3 in Band20 in a small-signal operation is illustrated in FIG. 7.

As illustrated in FIG. 7, the isolation in the reception signal band (791 MHz to 821 MHz) of Band 20 in the present embodiment (described as EMBODIMENT in FIG. 7) was improved by 11 dB or more, compared with that in the comparative example. Such improvement of the isolation enables the reception sensitivity of Band20 to be improved. In other words, since the degradation of the reception sensitivity in Band20 is capable of being suppressed in the present embodiment while the degradation of the reception sensitivity occurs in Band20 in the comparative example, it is possible to suppress an occurrence of the communication band having degraded reception sensitivity.

Although the improvement of the isolation characteristics in Band20 is described here, similar improvement is achieved or the isolation characteristics are kept in the other communication bands.

In particular, according to the present embodiment, as apparent from FIG. 2A and FIG. 2B and FIG. 5A and FIG. 5B, the transmission characteristics are capable of being kept without necessarily degradation, compared with the comparative example. In other words, according to the present embodiment, it is possible to suppress the signals (Rx-band noise) in the frequency bands of the reception signals, which leak into the reception side, while keeping the excellent transmission characteristics.

In addition, in the present embodiment, the first load impedance Z (PAout) in the frequency bands of the multiple reception signals when the multiple transmission-reception filters side is viewed from the output terminal of the amplifier 10 is positioned in an area the phase of which is apart from that of the maximum point of the gain of the amplifier 10 by 45 degrees or more in the first Smith chart normalized with respect to the output impedance (3Ω in the present embodiment) of the amplifier 10 (refer to FIG. 3A).

The positioning of the first load impedance Z (PAout) in an area the phase of which is apart from that of the maximum point of the gain of the amplifier 10 by 45 degrees or more in the first Smith chart in the above manner enables all the gains of the amplifier 10 in the frequency bands of the multiple reception signals to be made smaller than all the gains of the amplifier 10 in the frequency bands of the multiple transmission signals. Accordingly, advantages similar to the advantages described above are achieved. In other words, it is possible to suppress the degradation of the isolation between the transmission and reception terminals while supporting the multiband communication to suppress an occurrence of the communication band having degraded reception sensitivity.

Furthermore, in the present embodiment, the first load impedance Z (PAout) in the frequency bands of the multiple reception signals can be positioned in an area the phase of which is apart from that of the maximum point of the gain of the amplifier 10 by 90 degrees or more in the first Smith chart (refer to FIG. 3A).

The positioning of the first load impedance Z (PAout) in an area the phase of which is apart from that of the maximum point of the gain of the amplifier 10 by 90 degrees or more in the first Smith chart in the above manner enables the gains to be equalized while suppressing the gains of the amplifier 10 in the frequency bands of the reception signals. Accordingly, it is possible to suppress the variation in the reception sensitivity in the same communication band.

Furthermore, in the present embodiment, the common matching circuit 20 is provided between the amplifier 10 and the common node of the multiple signal paths (the common terminal of the switch 30 in the present embodiment) and the multiple individual matching circuits 40 are provided on the multiple signal paths 70.

With the multiple individual matching circuits 40 individually provided on the multiple signal paths 70, the load impedance in the frequency bands of the reception signals (the reception signal bands) when the individual matching circuits 40 side is viewed from the output terminal of the common matching circuit 20 is capable of being adjusted with high accuracy. Accordingly, it is possible to adjust the load impedance to the phase at which the impedance matching is easily achieved with the common matching circuit 20.

Furthermore, in the present embodiment, the phases of the second load impedance Z (SW) in the frequency bands of the multiple reception signals substantially coincide with each other in the second Smith chart normalized with respect to the impedance (the characteristic impedance of 50Ω in the present embodiment) of the multiple signal paths 70 (refer to FIG. 3B).

Accordingly, the phases of the load impedance in the frequency bands of the reception signals (the reception signal bands) when the individual matching circuits 40 side is viewed from the output terminal of the common matching circuit 20 substantially coincide with each other. Consequently, the impedance in the frequency bands is capable of being matched in the multiple communication bands on the same condition at the output terminal of the amplifier 10. In other words, the impedance matching is achieved in the multiple communication bands with the same matching circuit. As a result, it is possible to achieve the impedance matching in a broad band including the frequency bands of the reception signals in the multiple communication bands with the common matching circuit 20.

Furthermore, in the present embodiment, each of the multiple individual matching circuits 40 is configured so as to have a small amount of phase rotation in the second Smith chart.

In general, transmission loss (loss) caused by the matching circuit is increased with the increasing amount of phase rotation caused by the matching circuit. In addition, when the frequency band to be subjected to the impedance matching is a broad band, it is more difficult to achieve excellent impedance matching in the frequency bands with the increasing amount of phase rotation. Since the element values of the reactance elements composing the matching circuit are increased with the increasing amount of phase rotation, the matching circuit may be increased in size.

Accordingly, configuring the individual matching circuits 40 so that the amount of phase rotation is decreased enables the excellent impedance matching to easily achieved and enables the size of the individual matching circuits 40 to be reduced.

Specifically, in the present embodiment, each of one or more individual matching circuits 40 (all the multiple individual matching circuits 40 in the present embodiment), among the multiple individual matching circuits 40, is composed of the HPF type matching circuit or the LPF type matching circuit having a small amount of phase rotation.

Whether each of the individual matching circuits 40 is composed of the HPF type matching circuit or the LPF type matching circuit may not be based on the amount of phase rotation and may be based on, for example, the relationship of the magnitude of frequency between the frequency bands of the transmission signals and the frequency bands of the reception signals. Specifically, the individual matching circuits 40 (the individual matching circuits 41, 42, and the 44 in the present embodiment) corresponding to the communication bands (for example, Band26, Band8, and Band12) in which the center frequencies of the frequency bands of the transmission signals are lower than the center frequencies of the frequency bands of the reception signals are composed of the LPF type matching circuits. In contrast, the individual matching circuit 40 (the individual matching circuit 43 in the present embodiment) corresponding to the communication band (for example, Band20) in which the center frequency of the frequency band of the transmission signal is higher than or equal to the center frequency of the frequency band of the reception signal may be composed of the HPF type matching circuit.

The configuration of the PA module may be in modes different from that of the above embodiment. In other words, it is sufficient for the PA module to be configured so as to meet at least one of (i) and (ii) described below and the detailed configuration of the PA module is not limited to that in the above embodiment.

(i) All the gains of the amplifier 10 in the frequency bands of the multiple reception signals are smaller than all the gains of the amplifier 10 in the frequency bands of the multiple transmission signals.

(ii) The first load impedance Z (PAout) is positioned in an area the phase of which is apart from that of the maximum point of the gain of the amplifier 10 by 45 degrees or more in the first Smith chart.

Various modifications of the embodiment will be described with reference to FIG. 8 to FIG. 12.

(First Modification)

A first modification will now be described. Although each of the multiple individual matching circuits 40 is a two-stage LC filter in the above embodiment, each of the multiple individual matching circuits 40 may be a one-stage LC filter. A PA module configured in this manner will be described in the present modification.

Figure 8:
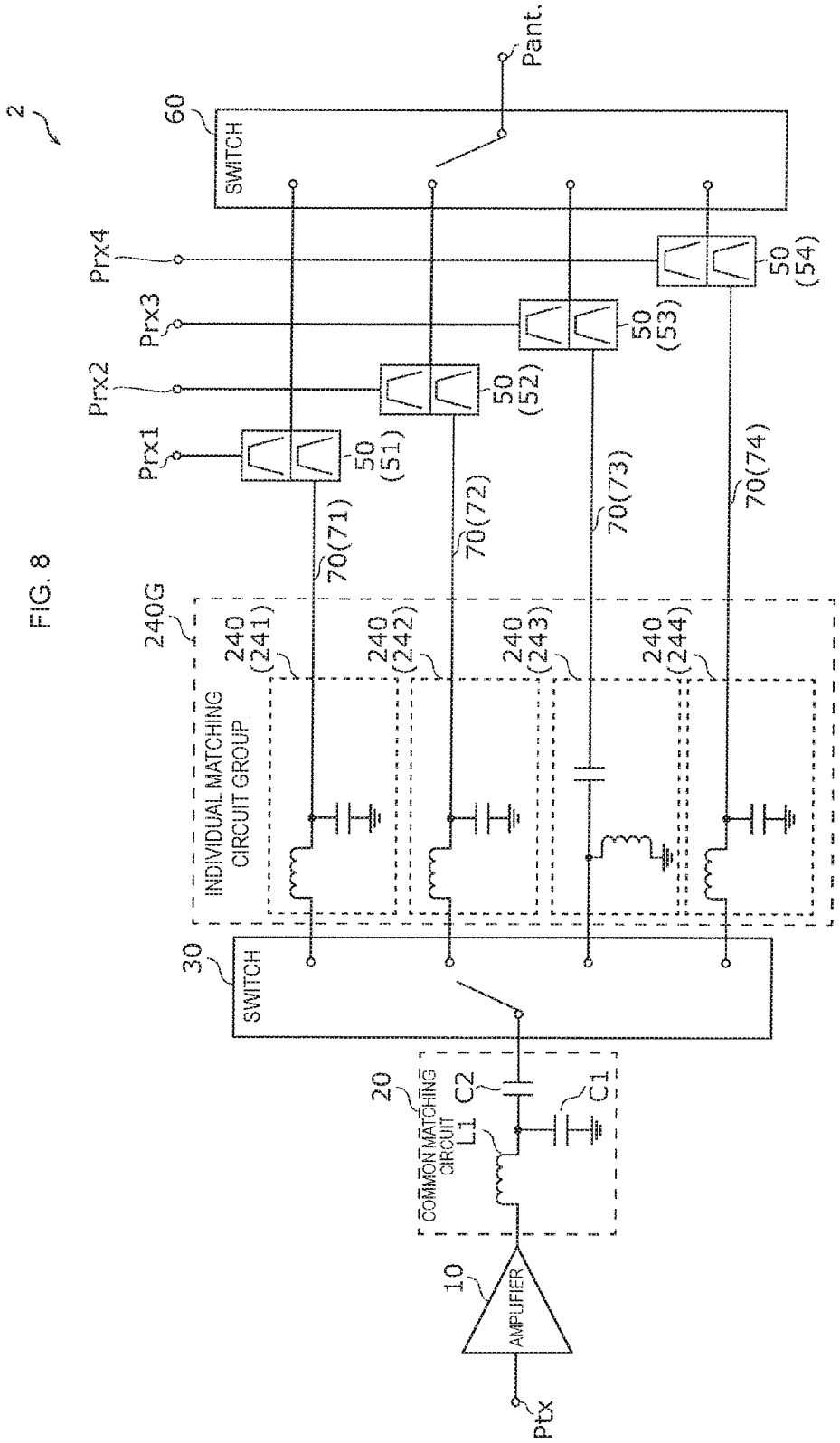
FIG. 8 is a diagram illustrating the circuit configuration of a PA module according to a first modification.

FIG. 8 is a diagram illustrating the circuit configuration of a PA module 2 according to the first modification.

The PA module 2 illustrated in FIG. 8 differs from the PA module 1 of the embodiment in that the PA module 2 includes an individual matching circuit group 240G including multiple individual matching circuits 240, instead of the individual matching circuit group 40G.

As illustrated in FIG. 8, each of the multiple individual matching circuits 240 (four individual matching circuits 241 to 244 in the present modification) is composed of a one-stage LC filter. Specifically, the individual matching circuits 241, 242, and 244 each includes the LPF type LC filter composed of an inductor, which is the series reactance element, and a capacitor, which is the parallel reactance element. The individual matching circuit 243 includes the HPF type LC filter composed of a capacitor, which is the series reactance element, and an inductor, which is the parallel reactance element.

Advantages similar to the advantages of the first embodiment are achieved also in the PA module 2 according to the present modification, which is configured in the above manner, by configuring the multiple individual matching circuits 240 so as to meet at least one of (i) and (ii) described above.

In addition, according to the present modification, since each of the multiple individual matching circuits 240 is composed of a one-stage LC filter, the circuit configuration is simplified and reduced in size.

(Second Modification)

A second modification will now be described. Although each of the multiple individual matching circuits is an LC filter in the embodiment and the first modification, each of one or more of the individual matching circuits, among the multiple individual matching circuits, may be composed of wiring or an inductor. A PA module configured in this manner will be described in the present modification.

Figure 9:
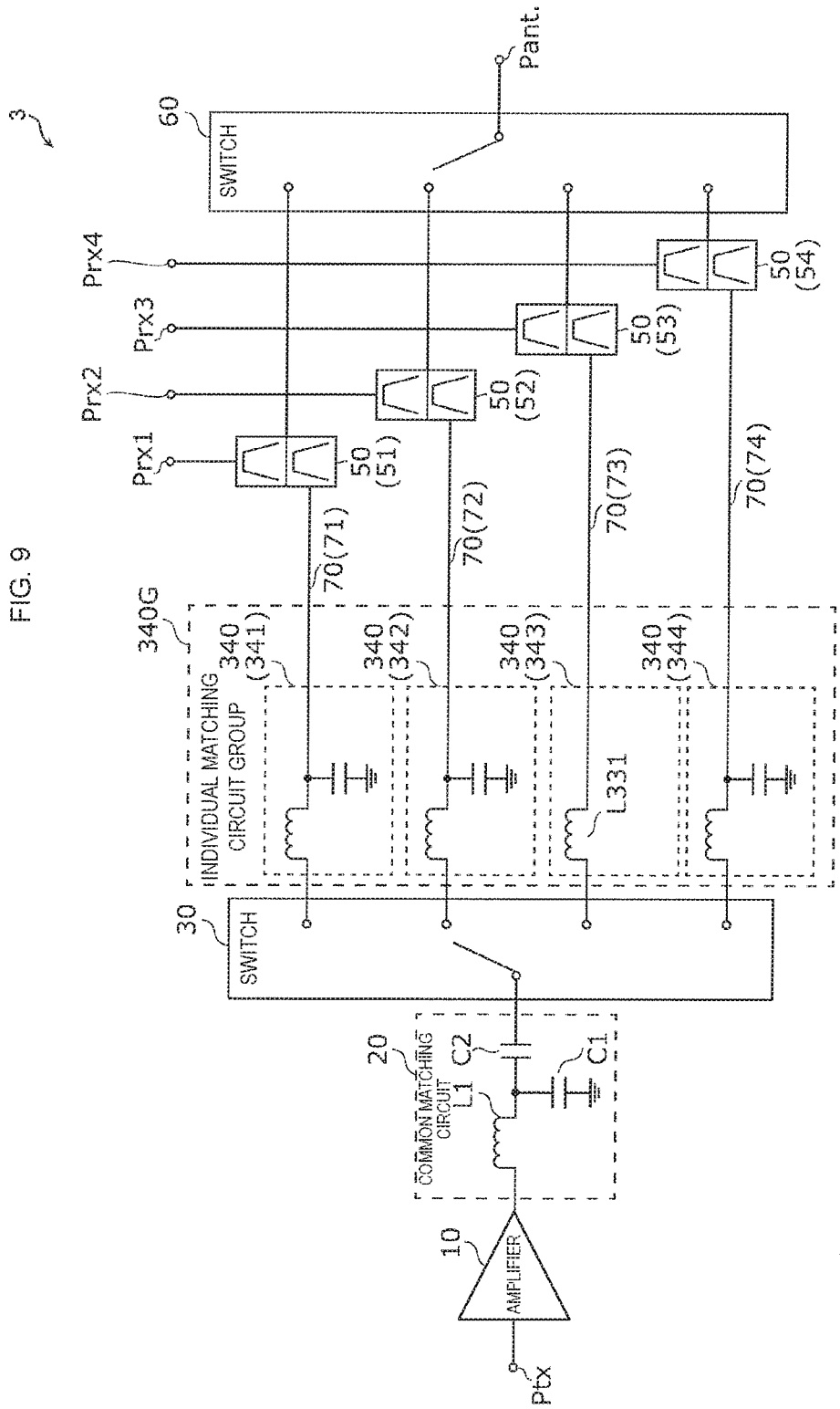
FIG. 9 is a diagram illustrating the circuit configuration of a PA module according to a second modification.

FIG. 9 is a diagram illustrating the circuit configuration of a PA module 3 according to the second modification.

The PA module 3 illustrated in FIG. 9 differs from the PA module 2 according to the first modification in that the PA module 3 includes an individual matching circuit group 340G including multiple individual matching circuits 340, instead of the individual matching circuit group 240G.

As illustrated in FIG. 9, at least one of the individual matching circuits, among the individual matching circuits 340, is composed of an inductor. Specifically, an individual matching circuit 343 is composed of an inductor L331, which is the series reactance element. In other words, the individual matching circuit 343 rotates the phase of the load impedance Z (SW) with the inductor L331 to move the phase of the load impedance Z (SW) to an arbitrary phase range.

Since the other individual matching circuits 341, 342, and 344 are the same as the individual matching circuits 241, 242, and 244 of the first modification, a description of them is omitted herein.

Advantages similar to the advantages of the first embodiment are achieved also in the PA module 3 according to the present modification, which is configured in the above manner, by configuring the multiple individual matching circuits 340 so as to meet at least one of (i) and (ii) described above.

In addition, according to the present modification, since at least one individual matching circuit 340 (one individual matching circuit 340 in the present modification) is composed of the inductor L331, the circuit configuration is simplified and reduced in size.

Although at least one individual matching circuit 340 is composed of the inductor L331 in the present modification, the individual matching circuit 340 may be wiring. The individual matching circuit 340 composed of wiring is capable of rotating the phase of the load impedance Z (SW) by the amount of phase rotation defined by the electrical length of the wiring to move the phase of the load impedance Z (SW) to an arbitrary phase range.

In addition, although one individual matching circuit 340, among the multiple individual matching circuits 340, is composed of the inductor or the wiring in the present modification, the number of the individual matching circuits configured in the above manner is not limited and multiple individual matching circuits may be configured in the above manner.

(Third Modification)

A third modification will now be described. Although the common matching circuit 20 is composed of the T-shaped circuit in the above embodiment and modifications, the configuration of the common matching circuit 20 is not limited to this and the common matching circuit 20 may be composed of, for example, a one-stage LC filter. A PA module configured in this manner will be described in the present modification.

Figure 10:
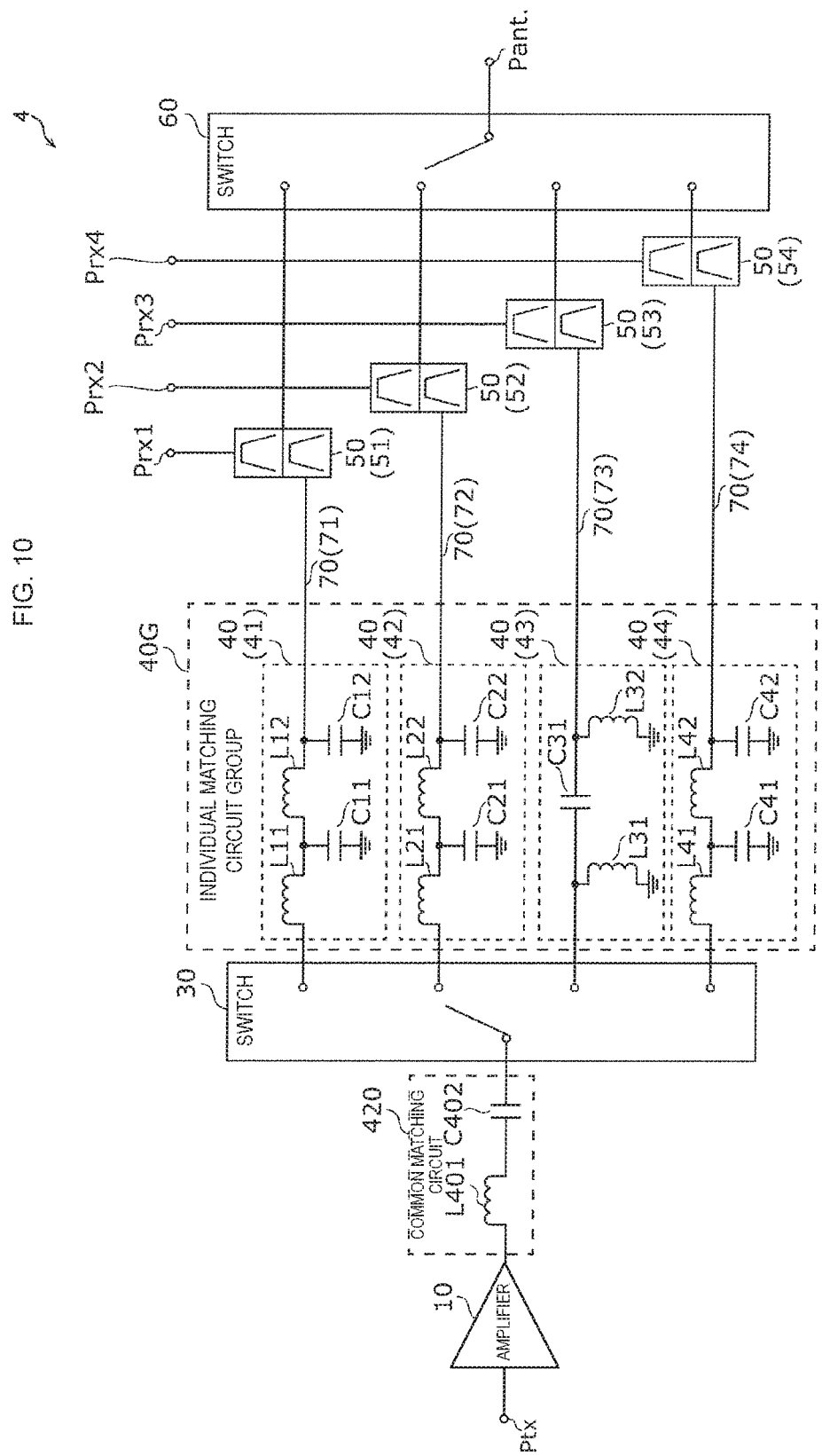
FIG. 10 is a diagram illustrating the circuit configuration of a PA module according to a third modification.

FIG. 10 is a diagram illustrating the circuit configuration of a PA module 4 according to the third modification.

The PA module 4 illustrated in FIG. 10 differs from the PA module 1 according to the embodiment in that the PA module 4 includes a common matching circuit 420 composed of a one-stage LC filter, instead of the common matching circuit 20. Specifically, the common matching circuit 420 sequentially includes an inductor L401 and a capacitor C402, which are the series reactance elements, from the amplifier 10 side. In other words, the common matching circuit 420 rotates the phase of the load impedance Z (PAout) with the inductor L401 and the capacitor C402.

As described above, each of the multiple individual matching circuits 40 is composed of a two-stage LC filter. In other words, each of the multiple individual matching circuits 40 includes an LC filter having the number of stages, which is larger than that of the common matching circuit 420.

Advantages similar to the advantages of the first embodiment are achieved also in the PA module 4 according to the present modification, which is configured in the above manner, by configuring the common matching circuit 420 so as to meet at least one of (i) and (ii) described above.

In addition, according to the present modification, the provision of the multiple individual matching circuits 40 having the number of stages in the LC filter, which is larger than that of the common matching circuit 420, enables the common matching circuit 420 to be simplified and reduced in size while adjusting with high accuracy the load impedance in the frequency bands of the reception signals (the reception signal bands) when the individual matching circuits 40 side is viewed from the output terminal of the common matching circuit 420.

(Fourth Modification)

A fourth modification will now be described. Although the individual matching circuits 40 are provided separately from the transmission-reception filters 50 in the above embodiment and modifications, the individual matching circuits may be incorporated in the transmission-reception filters. A PA module configured in this manner will be described in the present modification.

Figure 11:
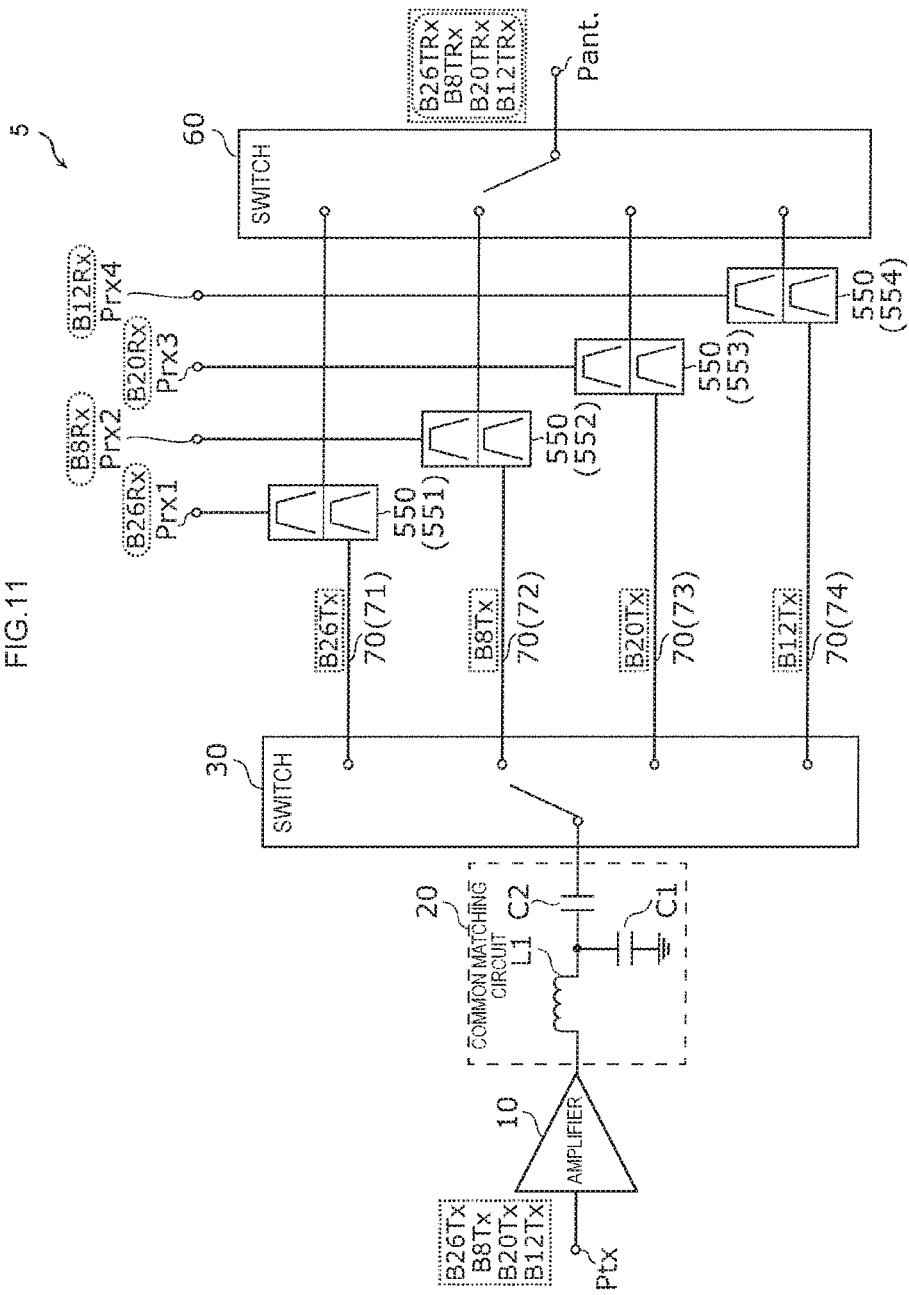
FIG. 11 is a diagram illustrating the circuit configuration of a PA module according to a fourth modification.

FIG. 11 is a diagram illustrating the circuit configuration of a PA module 5 according to the fourth modification.

The PA module 5 illustrated in FIG. 11 differs from the PA module 1 according to the embodiment in that the PA module 5 does not include the individual matching circuit group 40G and includes multiple transmission-reception filters 550 (four transmission-reception filters 551 to 554 in the present modification), instead of the multiple transmission-reception filters 50.

The multiple transmission-reception filters 550 are, for example, duplexers incorporating matching circuits. Specifically, the respective multiple individual matching circuits 40 in the embodiment are incorporated in the corresponding transmission-reception filters 550. For example, the individual matching circuit 41 corresponding to Band26 in the embodiment is incorporated in the transmission-reception filter 551 corresponding to Band26 in the present modification. Similarly, the other individual matching circuits 42 to 44 are incorporated in the corresponding transmission-reception filters 552 to 554.

Advantages similar to the advantages of the first embodiment are achieved also in the PA module 5 according to the present modification, which is configured in the above manner, by configuring the multiple transmission-reception filters 550 so as to meet at least one of (i) and (ii) described above.

In addition, according to the present modification, the respective multiple individual matching circuits 40 in the first embodiment are incorporated in the corresponding transmission-reception filters 550. Accordingly, the PA module 5 is simplified and reduced in size.

Although the respective multiple individual matching circuits 40 in the first embodiment are incorporated in the corresponding transmission-reception filters 550 in the present modification, it is sufficient to incorporate at least one individual matching circuit 40 in the corresponding transmission-reception filter 550 and part of the individual matching circuits 40 may not be incorporated in the transmission-reception filters 550.

(Fifth Modification)

A fifth modification will now be described. Although each of the PA modules includes the switch 30 and the switch 60 in the above embodiment and modifications, the PA module may be configured so as not to include such switches. Although the multiband PA modules supporting the four communication bands are provided in the above embodiment and modifications, a multiband PA module supporting three communication bands may be provided. A PA module configured in this manner will be described in the present modification.

Figure 12:
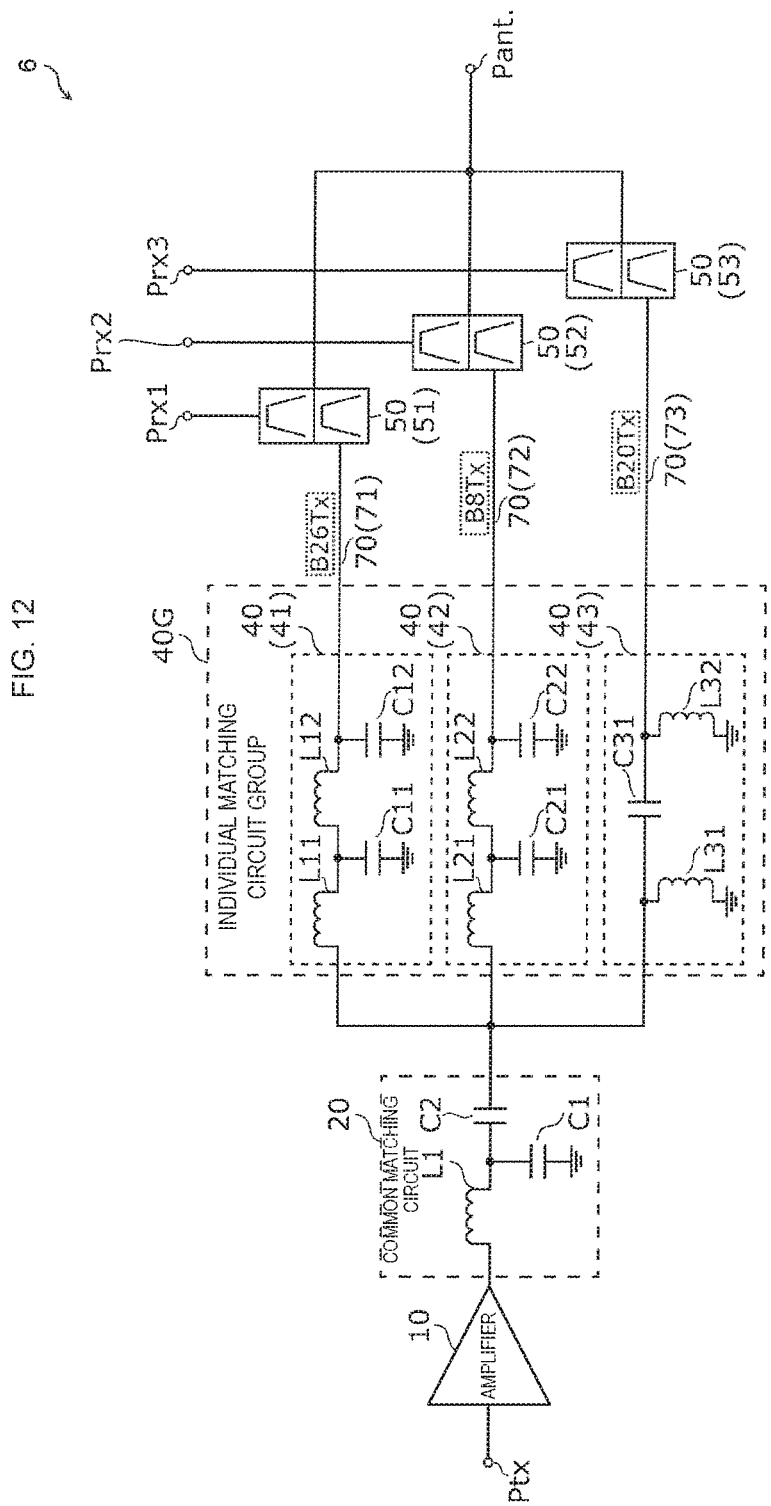
FIG. 12 is a diagram illustrating the circuit configuration of a PA module according to a fifth modification.

FIG. 12 is a diagram illustrating the circuit configuration of a PA module 6 according to the fifth modification.

The PA module 6 illustrated in FIG. 12 is a module that amplifies the transmission signals in three communication bands. The PA module 6 differs from the PA module 1 according to the embodiment in that the PA module 6 does not include the switch 30 and the switch 60. In other words, although the multiple signal paths 70 are bundled into the common node with the switch 30 in the above embodiment, the multiple signal paths 70 are directly bundled into the common node in the present modification.

Advantages similar to the advantages of the first embodiment are achieved also in the PA module 6 according to the present modification, which is configured in the above manner, by configuring the PA module 6 so as to meet at least one of (i) and (ii) with the common matching circuit 20, the individual matching circuits 40, and so on.

(Other Modifications)

Although the PA modules according to the embodiment and the modifications of the embodiment of the present disclosure are described above, the present disclosure is not limited to the individual embodiment and the modifications of the embodiment. Modes in which various modifications supposed by the persons skilled in the art are combined with the embodiment and the modifications of the embodiment and modes in which the components in different embodiment and modifications are combined with each other may be included within the range of one or more aspects of the present disclosure without necessarily departing from the spirit and scope of the present disclosure.

Although the PA modules are exemplified in the above description, the present disclosure may be applied to a demultiplexing apparatus in which the components composing the PA module are not modularized.

Although the case is exemplified in the above embodiment in which the PA module meets both (i) and (ii) described above, it is sufficient for the PA module to meet at least one of (i) and (ii). However, in the case in which the PA module meets both (i) and (ii), it is possible to further suppress an occurrence of the communication band having degraded reception sensitivity.

Although one of the multiple selection terminals (the four selection terminals in the above description) is connected to the common terminal in the switches 30 and 60 in the above embodiment, the configuration of the switches 30 and 60 is not limited to this. For example, two or more of the multiple selection terminals may be connected to the common terminal in the switches 30 and 60. In other words, in the switch 30, two or more signal paths 70, among the multiple signal paths 70, may be connected to the common node.

Adopting such a configuration enables the PA module to be applied to a so-called carrier aggregation method in which different communication bands are concurrently used.

Although the multiple signal paths 70 are bundled to be connected to one antenna terminal Pant. in the above description, the number of the antenna terminals is not limited to this and multiple antenna terminals may be used. In other words, the demultiplexing apparatus, such as the PA module, may be connected to multiple antennas, for example, corresponding to the communication bands.

The present disclosure may be realized as a method of designing the demultiplexing apparatus, such as the PA module. Here, the demultiplexing apparatus includes an amplifier that amplifies transmission signals of three or more communication bands having different frequency bands, multiple signal paths which are commonly provided for an output terminal of the amplifier and on which signals of the corresponding communication bands, among the multiple communication bands, are propagated, multiple transmission-reception filters which are provided on the multiple signal paths and each of which isolates a transmission signal and a reception signal of the corresponding communication band from each other, a common matching circuit provided between the output terminal and a common node of the multiple signal paths, and multiple individual matching circuits provided on the multiple signal paths between the common node and the multiple transmission-reception filters.

Figure 13:
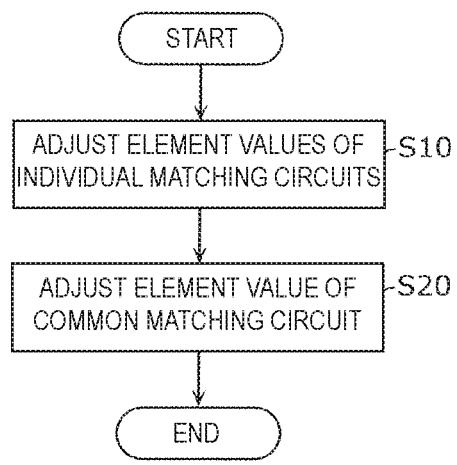
FIG. 13 is a flowchart illustrating a method of designing a demultiplexing apparatus.

FIG. 13 is a flowchart illustrating the method of designing the demultiplexing apparatus.

As illustrated in FIG. 13, the method of designing the demultiplexing apparatus includes a first adjusting step (S10) and a second adjusting step (S20). In the first adjusting step (S10), the element values of the multiple individual matching circuits are adjusted so that the phases of load impedance in frequency bands of multiple reception signals when the multiple transmission-reception filters side is viewed from the common node substantially coincide with each other in a Smith chart normalized with respect to the impedance of the multiple signal paths. In the second adjusting step (S20), the element value of the common matching circuit is adjusted so that the load impedance in the frequency bands of the multiple reception signals when the multiple transmission-reception filters side is viewed from the output terminal is positioned in an area the phase of which is apart from that of a maximum point of the gain of the amplifier by 45 degrees or more in a Smith chart normalized with respect to the output impedance of the amplifier after the first adjusting step (S10).

Such a method of designing the demultiplexing apparatus is performed by a computer, such as a computer aided design (CAD) apparatus. The designing method may be performed in the computer through an interactive operation between a designer and the computer.

INDUSTRIAL APPLICABILITY

The present disclosure is capable of being widely used in a communication device, such as a cellular phone, as a PA module capable of supporting the multiband communication.

REFERENCE SIGNS LIST

1, 1A, 2, 3, 4, 5, 6 PA module
10 amplifier
20, 20A, 420 common matching circuit
30, 60 switch
40, 40A, 41 to 44, 41A to 44A, 240 to 244, 340 to 344 individual matching circuit
40G, 240G, 340G individual matching circuit group
50 to 54, 550 to 554 transmission-reception filter
70 to 74 signal path
Pant. antenna terminal
Ptx transmission input terminal
Prx1 to Prx4 reception output terminal

The invention claimed is:

1. A demultiplexing apparatus comprising:
an amplifier that amplifies transmission signals in three or more communication bands;
three or more signal paths provided from an output terminal of the amplifier, each of the signal paths configured to propagate transmission signals corresponding to a different one of the three or more communication bands; and
three or more transmission-reception filters, each of the transmission-reception filters provided in a different one of the signal paths and configured to isolate transmission signals and reception signals of a corresponding communication band,
wherein, for each communication band, a gain of the amplifier in a reception frequency band of the communication band is less than a gain of the amplifier in a transmission frequency band of the communication band.

2. The demultiplexing apparatus according to claim 1, further comprising:
a common matching circuit provided between the output terminal and a common node of the signal paths; and
an individual matching circuit provided in each of the signal paths between the common node and the corresponding transmission-reception filter.

3. The demultiplexing apparatus according to claim 2, wherein phases of a second load impedance in the reception frequency band of each of the communication bands, when viewing the transmission-reception filters from the common node and when plotted in a second Smith chart normalized with respect to impedance of the signal paths, substantially coincide with each other.

4. The demultiplexing apparatus according to claim 3, wherein each of the individual matching circuits is configured so that an amount of phase rotation of the second load impedance due to the provision of the individual matching circuit is minimized in the second Smith chart.

5. The demultiplexing apparatus according to claim 4, wherein each individual matching circuit is a high pass filter type matching circuit or a low pass filter type matching circuit.

6. The demultiplexing apparatus according to claim 2,
wherein the common matching circuit and each of the individual matching circuits includes an LC filter of one or more stages, and
wherein the LC filters of each individual matching circuit has more stages than the LC circuit of the common matching circuit.

7. The demultiplexing apparatus according to claim 2,
wherein each of the individual matching circuits is incorporated in the corresponding transmission-reception filter.

8. The demultiplexing apparatus according to claim 2, further comprising:
a switch that is provided between the common matching circuit and the individual matching circuits and that is configured to selectively connect/disconnect at least one of the signal paths, among all of the signal paths, to the common node.

9. The demultiplexing apparatus according to claim 8,
wherein the switch is configured to connect at least two of the signal paths, among all of the signal paths, to the common node.

10. A demultiplexing apparatus comprising:
an amplifier that amplifies transmission signals in three or more communication bands;
three or more signal paths provided from an output terminal of the amplifier, each of the signal paths configured to propagate transmission signals corresponding to a different one of the three or more communication bands; and
three or more transmission-reception filters, each of the transmission-reception filters provided in a different one of the signal paths and configured to isolate transmission signals and reception signals of a corresponding communication band,
wherein, for each communication band, a first load impedance in a reception frequency band of the communication band, when viewing the corresponding transmission-reception filter from the output terminal and when plotted on a Smith chart normalized with respect to output impedance of the amplifier, is positioned in an area where the phase is apart from a maximum point of a gain of the amplifier by 45 degrees or more.

11. The demultiplexing apparatus according to claim 10,
wherein the first load impedance is positioned in an area where the phase is apart from the maximum point by 90 degrees or more in the first Smith chart.

12. The demultiplexing apparatus according to claim 10,
wherein, for each communication band, a gain of the amplifier in the reception frequency band of the communication band is less than a gain of the amplifier in a transmission frequency band of the communication band.

13. The demultiplexing apparatus according to claim 10, further comprising:
a common matching circuit provided between the output terminal and a common node of the signal paths; and
an individual matching circuit provided in each of the signal paths between the common node and the corresponding transmission-reception filter.

14. The demultiplexing apparatus according to claim 13,
wherein phases of a second load impedance in the reception frequency band of each of the communication bands, when viewing the transmission-reception filters from the common node and when plotted in a second Smith chart normalized with respect to impedance of the signal paths, substantially coincide with each other.

15. The demultiplexing apparatus according to claim 14,
wherein each of the individual matching circuits is configured so that an amount of phase rotation of the second load impedance due to the provision of the individual matching circuit is minimized in the second Smith chart.

16. The demultiplexing apparatus according to claim 15,
wherein each individual matching circuit is a high pass filter type matching circuit or a low pass filter type matching circuit.

17. The demultiplexing apparatus according to claim 13,
wherein the common matching circuit and each of the individual matching circuits includes an LC filter of one or more stages, and
wherein the LC filters of each individual matching circuit has more stages than the LC circuit of the common matching circuit.

18. The demultiplexing apparatus according to claim 13,
wherein each of the individual matching circuits is incorporated in the corresponding transmission-reception filter.

19. The demultiplexing apparatus according to claim 13, further comprising:
a switch that is provided between the common matching circuit and the individual matching circuits and that is configured to selectively connect/disconnect at least one of the signal paths, among all of the signal paths, to the common node.

20. The demultiplexing apparatus according to claim 19,
wherein the switch is configured to connect at least two of the signal paths, among all of signal paths, to the common node.

* * * * *